US012652992B2

(12) United States Patent
Yang et al.

(10) Patent No.: US 12,652,992 B2
(45) Date of Patent: Jun. 9, 2026

(54) SYSTEMS AND TECHNIQUES FOR OPTICAL MEASUREMENT OF THIN FILMS

(71) Applicant: Lam Research Corporation, Fremont, CA (US)

(72) Inventors: Liu Yang, Seattle, WA (US); Mengping Li, Sherwood, OR (US); Shantinath Ghongadi, Tigard, OR (US); Andrew James Pfau, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 445 days.

(21) Appl. No.: 18/260,713

(22) PCT Filed: Jan. 4, 2022

(86) PCT No.: PCT/US2022/011177
§ 371 (c)(1),
(2) Date: Jul. 7, 2023

(87) PCT Pub. No.: WO2022/150309
PCT Pub. Date: Jul. 14, 2022

(65) Prior Publication Data
US 2024/0055282 A1 Feb. 15, 2024

Related U.S. Application Data

(60) Provisional application No. 63/199,559, filed on Jan. 8, 2021.

(51) Int. Cl.
*H10P 72/00* (2026.01)
*G01N 21/84* (2006.01)
(Continued)

(52) U.S. Cl.
CPC ..... *H10P 72/0604* (2026.01); *G01N 21/8422* (2013.01); *H10P 74/203* (2026.01); *H10P 74/23* (2026.01)

(58) Field of Classification Search
None
See application file for complete search history.

(56) References Cited

U.S. PATENT DOCUMENTS 8,338,194 B2 * 12/2012 Hesse .................... G01N 21/45
438/16
2009/0082983 A1 3/2009 Yamashita et al.
(Continued)

FOREIGN PATENT DOCUMENTS

JP H0817743 A 1/1996
KR 101453819 B1 10/2014

OTHER PUBLICATIONS

International Preliminary Report on Patentability dated Jul. 20, 2023, in Application No. PCT/US2022/011177.
(Continued)

*Primary Examiner* — Jack S Chen
(74) *Attorney, Agent, or Firm* — Weaver Austin Villeneuve & Sampson LLP

(57) ABSTRACT

Methods provided herein may include illuminating a region on a wafer within a semiconductor processing tool, the wafer having a layer of a material that is at least semi-transparent to light and has a measurable extinction coefficient, and the region being a first fraction of the wafer's surface, detecting light reflected off the material and off a surface underneath the material using one or more detectors and generating optical data corresponding to the detected light, generating a metric associated with a property of the material on the wafer by applying the optical data to a transfer function that relates the optical data to the metric associated with the property of the material on the wafer, determining an adjustment to one or more processing parameters for a processing module, and performing or modifying a processing opera-
(Continued)

tion in the processing module according to the adjusted one or more processing parameters.

20 Claims, 15 Drawing Sheets

(51) Int. Cl.
    *H10P 74/00*       (2026.01)
    *H10P 74/20*       (2026.01)

(56)               References Cited

U.S. PATENT DOCUMENTS

| | | |
|---|---|---|
| 2010/0291714 A1 | 11/2010 | Hesse et al. |
| 2018/0144995 A1 | 5/2018 | Kim et al. |

OTHER PUBLICATIONS

International Search Report and Written Opinion dated Apr. 25, 2022, in International Application No. PCT/US2022/011177.
TW Office Action and Search Report dated May 28, 2025 in TW Application No. 111100543, with English Translation.

\* cited by examiner

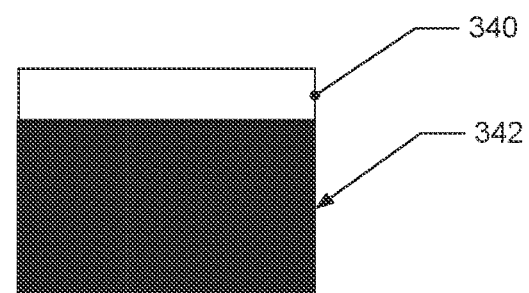
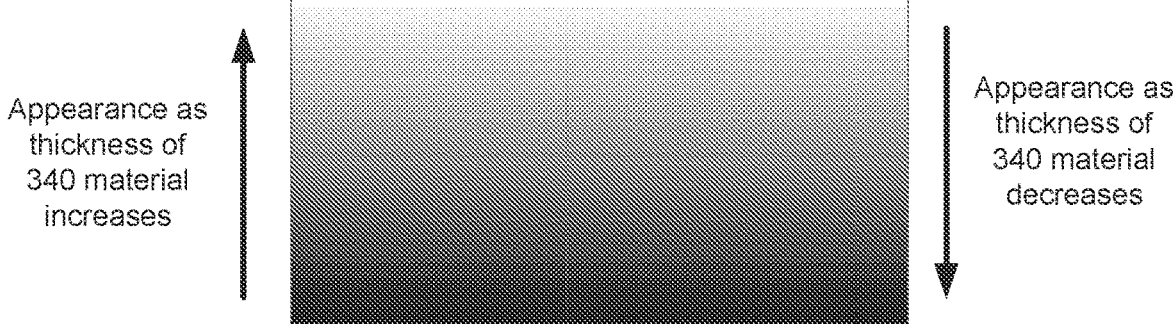
Figure 3A
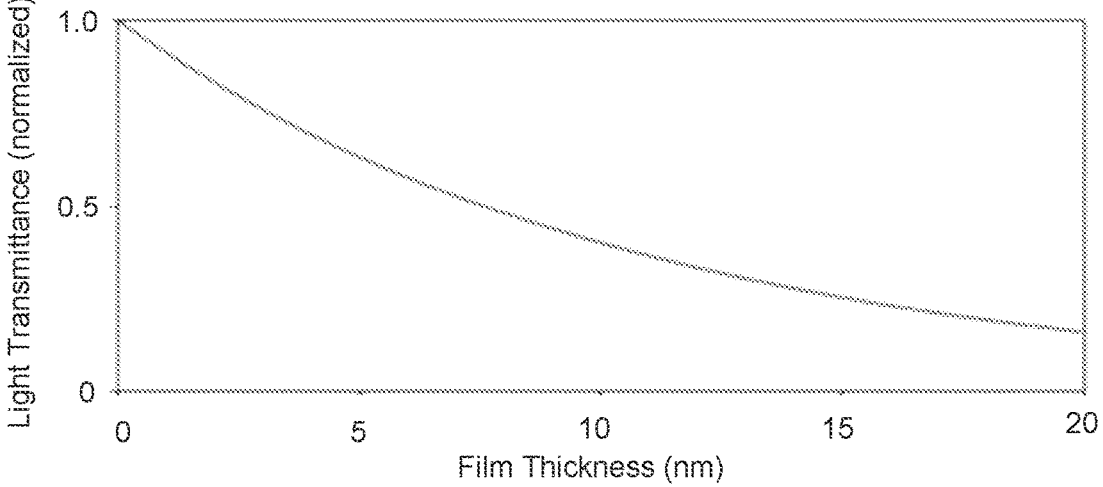
Figure 3B

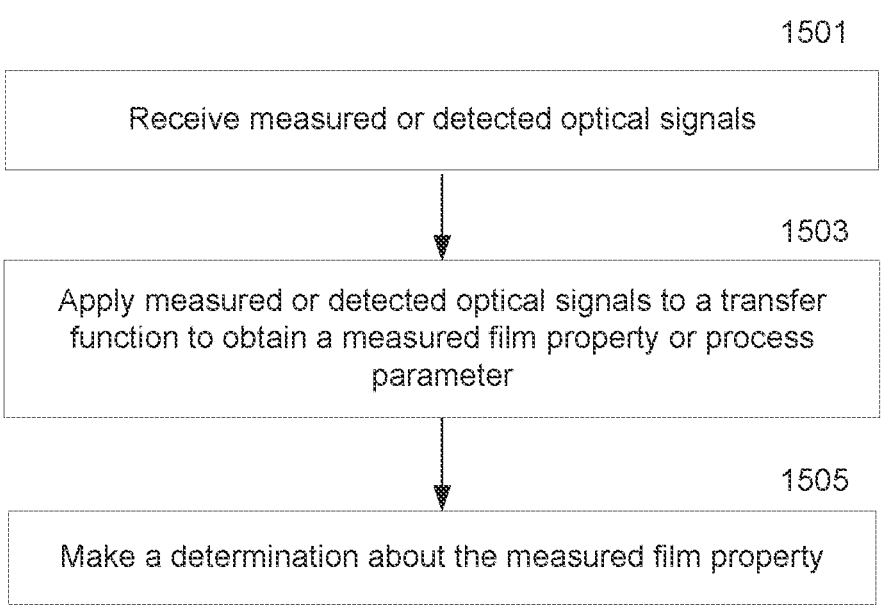

1501

Receive measured or detected optical signals

1503

Apply measured or detected optical signals to a transfer function to obtain a measured film property or process parameter

1505

Make a determination about the measured film property

Receive measured or detected optical signals

1509

Apply measured or detected optical signals to a transfer function to determine a difference between the measured optical signals and target optical signals

1511

Determine an adjustment to a process parameter

Figure 15B

SYSTEMS AND TECHNIQUES FOR OPTICAL MEASUREMENT OF THIN FILMS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Electronic devices are fabricated on substrates such as semiconductor wafers using a variety of processing techniques such as deposition, masking, etching, cleaning and/or other treatments. Examples of deposition techniques include electroplating, electroless deposition, chemical vapor deposition (CVD), physical vapor deposition (PVD), atomic layer deposition (ALD), etc. Examples of removal or etching techniques include stripping, wet etching, dry etching, chemical mechanical polishing (CMP), etc.

During production, it is desirable to assess the substrates to determine whether processing is being performed correctly and/or to adjust the process prior to production of subsequent substrates.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

The systems, methods, and apparatuses of this disclosure each have several innovative aspects, no single one of which is solely responsible for the desirable attributes disclosed herein. Included among these aspects are at least the following implementations, although further implementations may be set forth in the detailed description or may be evident from the discussion provided herein.

In some embodiments, a method of processing wafers in a semiconductor processing tool having a processing chamber and an optical metrology module may be provided. The method may include illuminating a first region on a first wafer while the first wafer is positioned within the semiconductor processing tool, the first wafer having a first layer of a first material that is at least semi-transparent to light and has a measurable extinction coefficient, and the first region being a first fraction of the first wafer's surface, detecting, while the first wafer is positioned within the semiconductor processing tool, light reflected off the first material and off a surface underneath the first material in the first region of the first wafer using one or more detectors of the optical metrology module and generating first optical data corresponding to the detected light, generating a metric associated with a property of the first material on the first wafer by applying the first optical data to a transfer function that relates the first optical data to the metric associated with the property of the first material on the first wafer, determining, based on the applying, an adjustment to one or more processing parameters for a processing module of the semiconductor processing tool, and performing or modifying a processing operation in the processing module according to the adjusted one or more processing parameters.

In some embodiments, the processing operation may be performed on a second wafer that enters the processing module after the first wafer was processed in the processing module.

In some such embodiments, the adjustment may cause the first layer of the first material on the second wafer to have a second metric different than the metric, and the property may be thickness, index of refraction, surface roughness, density, or a variation of any of the foregoing over the wafer surface.

In some such embodiments, the adjustment may cause the metric of the property of the first material to remain substantially the same during the processing operation, and the property, may be thickness, index of refraction, surface roughness, and density.

In some such embodiments, the method may further include illuminating a second region of the second wafer positioned within the semiconductor processing tool, the second region being a second fraction of the second wafer's surface, detecting, while the second wafer is positioned within the semiconductor processing tool, light reflected off the first material and off a surface underneath the first material in the second region of the second wafer using the one or more detectors and generating second optical data corresponding to the detected light, generating a second metric associated with the property of the first material on the second wafer by applying the second optical data to a transfer function that relates the second optical data to the second metric associated with the property of the first material on the second wafer, determining, based on the applying, a second adjustment to one or more processing parameters for the processing module, and performing or modifying a second processing operation in the processing module according to the second adjusted one or more processing parameters.

In some embodiments, generating the first optical data may be performed before the first wafer has been fully processed in the processing module, and performing or modifying the processing operation may include modifying the processing operation before the first wafer has been fully processed in the processing module.

In some such embodiments, the method may further include, after the performing or modifying, illuminating a first region on a first wafer while the first wafer is positioned within the semiconductor processing tool, detecting, while the first wafer is positioned within the semiconductor processing tool, light reflected off the first material and off the surface underneath the first material in the first region of the first wafer using one or more detectors and generating second optical data corresponding to the detected light, generating a second metric associated with the property of the first material on the first wafer by applying the second optical data to a transfer function that relates the second optical data to the second metric associated with the property of the first material on the first wafer, determining, based on the applying, a second adjustment to one or more processing parameters for a processing module of the semiconductor processing tool, and performing or modifying a second processing operation in the processing module according to the second adjusted one or more processing parameters.

In some embodiments, the adjustment may include an adjustment to a deposition time, a wafer temperature, a sequencing and/or timing of solution dispensing locations, a flow rate, a chuck rotation speed, a purge gas flow rate, an RF power, an e-beam power, a chamber pressure, a target position and orientation towards substrate, a bias voltage or waveform, precursor flow rate, carrier gas flow rate, orientation and location of various chamber components to shape a plasma, or a combination thereof.

In some embodiments, the generating may include determining a difference between the first optical data and target optical data.

In some such embodiments, the method may further include determining whether the difference between the first optical data and the target optical data exceeds a threshold, the determining the adjustment being further based on the determination of whether the difference exceeds the threshold.

In some embodiments, the first optical data may include a first subset of optical data associated with an interior region of the first wafer and a second subset of optical data associated with an edge region of the first wafer, and the generating may include determining a difference between the first subset and the second subset.

In some embodiments, the generating may include determining a difference between the first optical data and optical data from a second wafer.

In some embodiments, the method may further include causing relative motion between the first wafer and one or more detectors during the illuminating and the detecting.

In some embodiments, the metric may be further based on calibration data.

In some such embodiments, the calibration data may be based on target data of target wafers.

In some embodiments, the first fraction may able at least one fifth the surface area of the first wafer.

In some such embodiments, the first fraction may be at least 80% of the surface area of the first wafer.

In some embodiments, the processing operation in the processing module may deposit material onto a wafer, and the adjustment to the one or more processing parameters may reduce non-uniformity of the deposited material.

In some embodiments, the light may be white light.

In some embodiments, the light may have wavelengths between about 375 nm and about 800 nm.

In some embodiments, a semiconductor processing tool may be provided. The semiconductor processing tool may include a processing module configured to perform one or more processing operations on a wafer, the wafer having a first layer of a first material that is at least semi-transparent to light and has a measurable extinction coefficient, an optical metrology module having an illumination source configured to emit broadband light onto a first region of the wafer, and having one or more detectors configured to detect light from reflected off the first material and off a surface underneath the first material in the first region of the wafer, the first region being a first fraction of the wafer's surface and a controller comprising one or more processors and one or more non-transitory memory devices that store instructions for controlling the one or more processors to cause the illumination source to illuminate the wafer, cause the one or more detectors to detect light reflected off the wafer and off the surface underneath the first material in the first region of the wafer generate first optical data corresponding to the detected light, generate a metric associated with a property of the first material on the wafer by applying the first optical data to a transfer function that relates the first optical data to the metric associated with the property of the first material on the wafer, determine, based on the applying, an adjustment to one or more processing parameters for the processing module, and perform or modifying a processing operation in the processing module according to the adjusted one or more processing parameters.

In some embodiments, the one or more detectors may include a camera configured to capture an image of at least a portion of the top surface of the wafer.

In some such embodiments, the camera may include a sensor that may be a charge-coupled device sensor, a photomultiplier tube sensor, an active-pixel sensor, or a complementary metal oxide semiconductor sensor.

In some such embodiments, the illumination source may emit broadband light onto the top surface of the wafer, and the camera may be configured to capture an image of the top surface of the wafer.

In some embodiments, the broadband light may be white light.

BRIEF DESCRIPTION OF THE DRAWINGS

FIG. 3A depicts illustrations of deposited film appearance.

FIG. 3B depicts a graph of film thickness versus light transmittance.

FIGS. 15A and 15B depict two simplified techniques for processing the measured optical signals.

DETAILED DESCRIPTION

Figure 1:
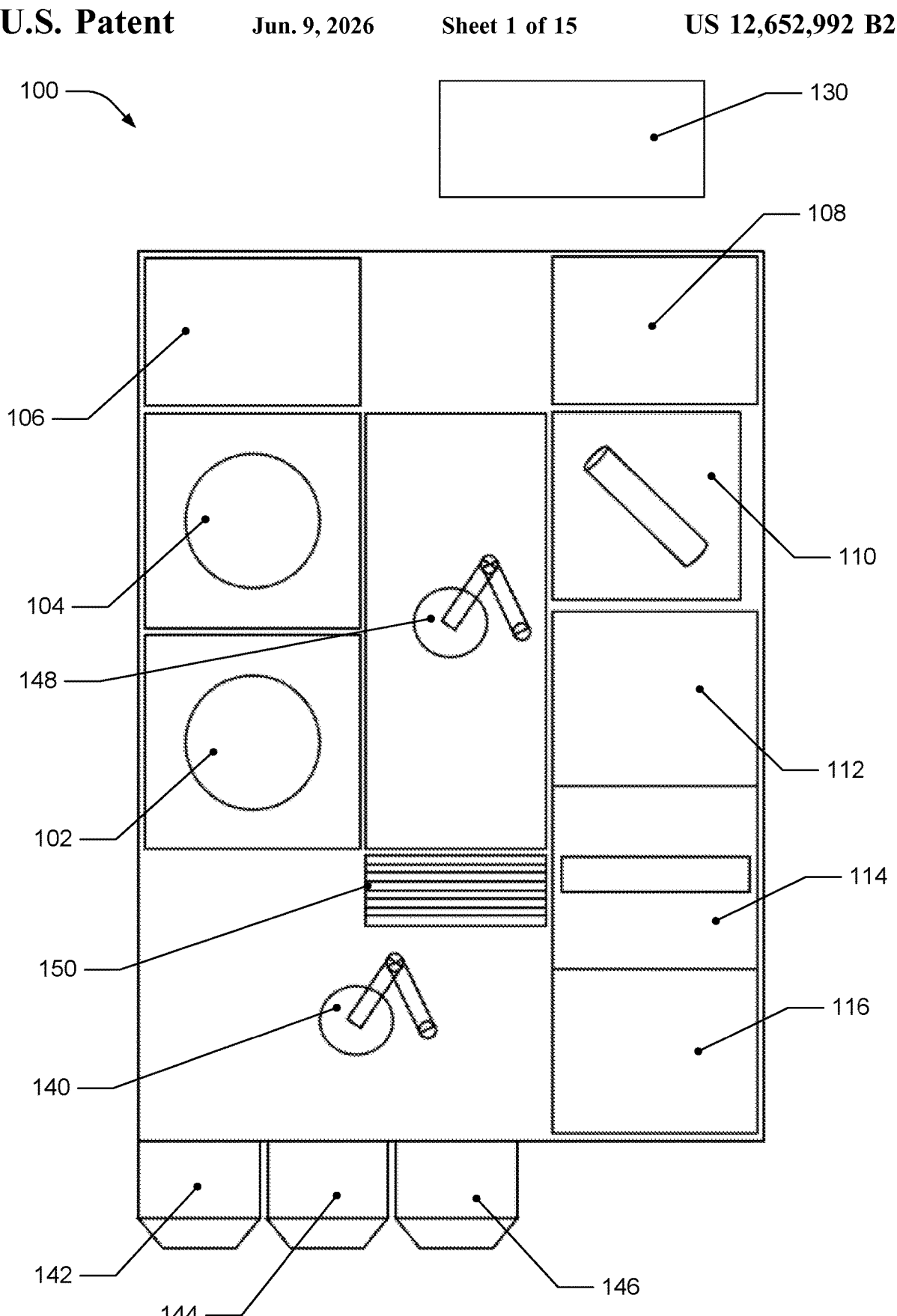
FIG. 1 depicts a top view of an example semiconductor processing tool configured to perform electroless deposition.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Introduction and Context

Semiconductor processing typically involves the deposition, masking, etching, and/or cleaning of thin layers of material, including of metals, which are sometimes referred to as thin films. These layers of material may have a thickness less than about 50 nanometers (nm), including less than about 20 nm. Some such thin films may be at least partially transparent in the visible range.

In many deposition processes, it is desirable to deposit a film with a uniform thickness (or at least a film with a thickness less than a threshold amount of non-uniformity) across an entire substrate, e.g., a semiconductor wafer. For example, film uniformity may adversely affect a resulting device's characteristics and functionality, by causing defects or other issues with functionality, notably electrical characteristics resulting from non-uniformities in an electroless deposition process, a silicide/salicide formation operation, or a cobalt capping operation. Similarly, in many etching or removal operations, it is often desirable to remove the target material in a uniform manner.

It is therefore desirable to determine the thickness of one or more layers of material on the substrate, and in some instances, also determine other characteristics of these layers, such as density, surface roughness, or refractive index (RI). In some instances, it is desirable to measure and determine these characteristics during processing of a batch of substrates in order to detect and adjust for substrate nonuniformity, process shifts, and/or other film property nonuniformity before, during, and/or after the substrate undergoes a processing operation. However, many current techniques for measuring and determining these film properties have significant disadvantages.

Some current techniques do not directly monitor the deposited film properties, but instead directly monitor and measure various processing conditions to indirectly evaluate and infer some film properties. In many instances, these indirect measures do not accurately predict or measure film properties. For example, in some electroless deposition (ELD) processes, the pH, UV-visibility, and/or conductance (Raman) of the ELD bath may be measured and monitored, but the variability and/or stability of these conditions do not necessarily correlate with film thicknesses. In one example, two ELD deposition processes were performed and between these two processes, the pH varied by about 0.02 pH, the UV-visibility varied by about 0.5%, and the Raman varied by about 3%, which are all within acceptable tolerances, but the thickness varied by about 50%, with one thickness twice as large as the other thickness. Accordingly, directly monitoring various processing conditions does not necessarily provide an accurate measurement of at least some film properties.

Many current techniques for directly measuring and determining film properties also have disadvantages. Some such current techniques include x-ray fluorescence (XRF), x-ray reflectivity (XRR), top-down energy dispersive x-ray spectroscopy (EDX), eddy current measurement, optical interferometry, film reflectivity, or scanning ellipsometry. Many of these techniques are generally valid on non-patterned wafers, not on patterned wafers, because such techniques can be prone to error from sample-to-sample variability on a patterned surface due to the analysis spot size. For example, XRF may provide a valid result if measured on a large non-patterned region within a die on the product wafer, but the measurement result can vary significantly if there are both patterned and non-patterned regions being measured in the spot size of the XRF, and there may be additional XRF error if the depth or width of the metal-filled or metal-capped feature is varying for each sample, even if the deposited metal thickness is consistent.

Furthermore, the underlying layers in a product wafer may adversely affect and influence the measured result. For example, an XRF measurement result of a metal layer may be misleading if that same metal is present in other layers underneath the metal layer of interest. Also, for example, the conductivity of a doped silicon substrate, and any contribution towards overall conductivity of the film stack, may influence and in some cases make meaningless the eddy current measurement of the deposited thin metal film of interest.

Additionally, many of the current techniques for measuring and determining film properties, including film thickness, are time-consuming and require large and costly separate equipment. For example, an XRF measurement may take multiple minutes, such as about 15 minutes or more to gather about 50 measurement points on a substrate, which may be the same amount of time for numerous wafers to be processed. If the processing tool is not operating during this measurement time, then this delay undesirably reduces throughput, and if the processing tool is operating during this measurement time, then this delay may cause numerous substrates to be processed with defects that were not detected until the measurements are complete.

In some instances, the equipment necessary to perform some of the current techniques, sometimes referred to as metrology equipment, are large and may require as much floor space as a processing tool itself, thereby reducing throughput by preventing a processing tool from being used in the same space. Similarly, this same metrology equipment may also be separate from the processing tool which may not only cause delay by requiring transfer time from the processing tool to the separate equipment but may also adversely affect the wafer and cause inaccurate results. For example, some thin metal films begin to oxidize when they are exposed to the ambient environment outside the processing tool which may occur during a transfer between the processing tool and the metrology equipment. This oxidization may be an unwanted reaction on the substrate and also may affect the measurement result of the metal film.

Certain disclosed embodiments provide optical equipment, referred to herein as an optical metrology module, on a semiconductor processing tool to determine properties of a thin film, such as thickness, density, and/or RI, quickly, non-destructively, and with repeatable results of multiple substrates. Provided herein are various systems, apparatuses, and techniques for using an optical metrology module to determine a film thickness and, in some instances, other film characteristics such as film density, surface roughness, and/or RI. In some implementations, systems or techniques may be configured to assess non-uniformity, such as center to edge non-uniformity, of any of these film properties. In some embodiments, the optical metrology module may include one or more detectors for detecting optical signals reflected off the substrate, e.g., a camera or a spectrometer such as a reflectivity probe, and a positioning mechanism configured to cause relative position between the substrate and the one or more detectors, e.g., positioning and/or moving the substrate relative to the one or more detectors, or positioning and/or moving the one or more detectors relative to the substrate. Some implementations may optionally include one or more illumination sources that are configured to emit one or more sources of light onto the substrate, such as in the visible spectrum, outside the visible spectrum, a broadband spectrum, specific wavelengths, or ranges of wavelengths.

In some embodiments, the optical detection techniques are facilitated in part by the deposited thin films having a thickness that is partially transparent to some light wavelengths which enables some light to pass through and reflect off the material underneath the film. The one or more detectors are configured to detect this reflected light and the optical metrology module is configured to determine the thin film's thickness based in part on the detected light. Some of these deposited thin films also have high extinction coefficients which result in large changes to the films' transparency based on relatively small changes to the films' thickness, and thus large changes to the films' transparency and resulting reflection of light off the underlying material. For example, changes of a cobalt film thickness between about 2 nm and 10 nm covering a copper layer of material result in detectable changes to some wavelengths of light reflected by the underlying copper. These detectable changes of reflected light can be measured and used to determine corresponding film thickness. Some determinations may use modeling, such as a regression or polynomial fit, that quantifies a relationship or metric between measured light signals reflected off calibration or test substrates having known film thicknesses deposited on an underlying layer of material and these known film thicknesses.

Semiconductor Processing Tools with Multiple Modules Including an Optical Metrology Module The semiconductor processing took (took) described herein may include various and multiple processing modules that are configured to perform processing operations, such as depositing material onto substrates or etching material from substrates. The tools described herein also are considered to have an optical metrology integrated as part of the tool, including as part of the tool's platform. This may include having the optical metrology module as a separate module in the tool, along with other processing modules of the tool, and/or it may include incorporating the optical metrology module into a module on the tool. In some implementations, the tool may be configured to perform electroless deposition (ELD) which may be considered a bottom-up feature fill deposition or a metal-selective capping deposition. In ELD, a substrate is positioned in a plating solution of an ELD cell and an autocatalytic chemical reduction of metal cations in the plating solution causes metals and alloys to be deposited onto the substrate.

Some tools configured to perform ELD may have one or more electroless cells, a plating bath reservoir, a wafer positioning robot, a wafer rinse and/or dry module, and an optical metrology module. FIG. 1 depicts a top view of an example semiconductor processing tool configured to perform ELD. The ELD apparatus 100 can include two separate ELD deposition modules 102 and 104 and each ELD module may be considered a stack of two ELD chambers arranged vertically with one ELD chamber above the other; this ELD apparatus 100 may therefore include four ELD chambers. The ELD apparatus 100 can also include additional separate modules 106, 108, 110, 112, 114, and 116 configured for various process operations or post-deposition processes. For example, in some embodiments, 108 may be a brush support, 110 may be a brush box for processing a wafer, 112 may be an cleaner inbound module for preparing a wafer for cleaning, 114 may be a cleaning module configured to clean the wafer, and 116 may be a cleaner outbound module for processing a wafer after cleaning. In some embodiments, module 106 may be a metrology module, separate from an optical metrology module described herein, that is configured to perform bath metrology, such as determining the pH, Vis, and Raman of the deposition bath. Here in FIG. 1, the optical metrology module is a part of the tool 100 and may be a separate module of the apparatus/tool 100 and/or a part of one of the existing modules, such as a wafer process module or module that accepts a wafer which may include cleaner outbound module 116.

Although not shown in FIG. 1, the ELD apparatus 100 may include a central fluid management system and other aspects. The central fluid management system may be a module that holds the chemical solution used as the ELD deposition solution in the ELD modules 102 and 104. The ELD apparatus 100 may also include a dosing system that may store and deliver additives for the ELD deposition solution. A chemical dilution module such as 106 or 108 may store and mix chemicals to be used as an etchant. A filtration and pumping unit may filter the ELD deposition solution for the central electrodeposition chamber and pump it to the ELD modules.

A system controller 130 provides electronic and interface controls required to operate the ELD apparatus 100. Details of this system controller 130 are provided farther below.

A hand-off tool 140 may select a substrate from a substrate cassette such as the cassette 142, 144, or 146. The cassettes 142, 144, and 146 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 140 may hold the substrate using a vacuum attachment or some other attaching mechanism.

The hand-off tool (e.g. hand-off robot) 140 may interface with a wafer handling station (not shown), the cassettes 142 or 144, a transfer station 150, or an aligner (not shown). From the transfer station 150, a hand-off robot 148 may gain access to the substrate. The transfer station 150 may be a slot or a position from and to which hand-off tools 140 and 148 may pass substrates without going through the aligner. In some embodiments, however, to ensure that a substrate is properly aligned on the hand-off robot 148 for precision delivery to an electroplating module, the hand-off robot 148 may align the substrate with an aligner. The hand-off robot 148 may also deliver a substrate to one of the ELD modules 102 or 104, including to one of the two ELD chamber in each of the ELD modules 102 or 104, or to one of the other modules configured for various process operations.

Figure 2:
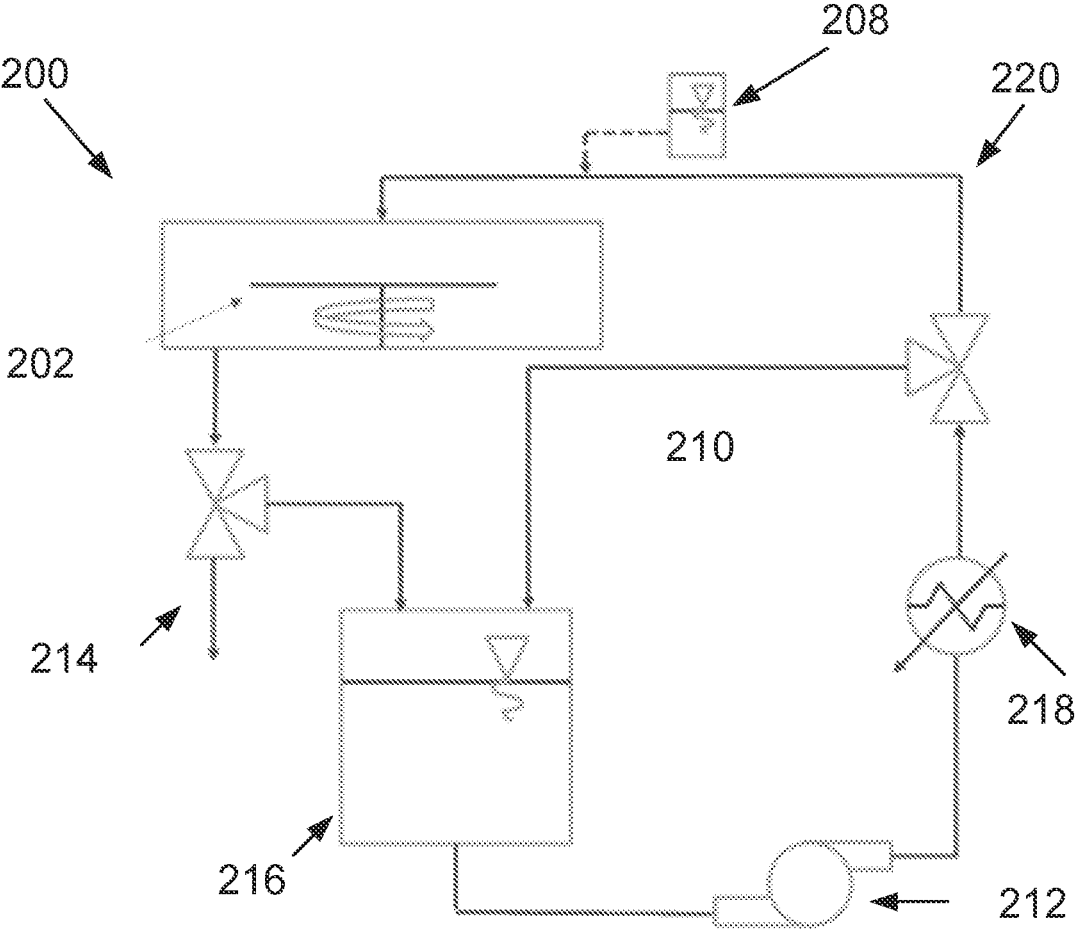
FIG. 2 depicts a simplified cross-sectional schematic of an electroless plating apparatus.

FIG. 2 depicts a simplified cross-sectional schematic of an electroless plating apparatus suitable for implementation of a bottom-up feature fill, in particular ELD, in accordance with some embodiments, Chamber 200 may be considered a part of the ELD modules 102 and 104 of FIG. 1. Chamber 200 includes a rotating chuck 202 on top of which a wafer or substrate rests. The wafer is heated by deposition solution that comes into the deposition chamber at elevated temperature. The deposition solution that leaves the wafer's surface is either drained or recovered back into the chemical tank 216 which contains the deposition solution.

The electroless deposition system can operate in point-of-use (POU) mode or in recirculation/recovery mode. In one embodiment, the POU involves adding a reducing agent from a reducing agent tank 208. The recirculation loop 210 can be maintained at room temperature or elevated temperature as needed, for example by a heater 218. Fluid is moved through recirculation loop 210, for example by pump 212, and feeds into delivery line 220, which ultimately delivers the fluid to a top surface of a wafer on the chuck 202.

In some embodiments, the film deposited using ELD may be cobalt, a cobalt alloy copper, a copper alloy, nickel, a nickel alloy, or ruthenium for example. The portion of the plating solution recirculated in the recirculation loop may have a composition configured to deposit the desired material onto the substrate. One skilled in the art should appreciate that many other versions of plating solutions (e.g., with alternative metal ion sources, complexing agents, reducing agents, buffering agents, pH adjustors, stabilizers, surfactants, etc.) may be incorporated with the embodiments described herein as the above referenced solution compositions are exemplary and not meant to be limiting.

The optical metrology module may be provided together with another module in the tool, such as a wafer positioning module (or a wafer transfer module), a drying module, a load-lock, a wafer aligner, or a buffer station before entry into a module, such as before wafer transfer into the cleaning module. In some embodiments, the optical metrology module may be a separate portion of the tool, such as a standalone module within the tool and configured to receive or transport a wafer (e.g., by using a wafer transfer robot), as seen in FIG. 1 as separate optical metrology module 106. In this embodiment, the hand-off robot 148 may move a wafer into the optical metrology module 106, position it therein, and move the wafer out. As discussed below, this hand-off robot 148 may be considered the movement mechanism that moves the wafer respect to the one or more detectors in the optical metrology module 106.

As mentioned above, in some embodiments, the deposited films have final thicknesses that are at least partially transparent to some wavelengths of light. This partial transparency allows some light to pass through the film, interact with the material underneath the film, reflect off this underlying material, and be detected by the one or more detectors. In conjunction with these small films being semi-transparent to some wavelengths of light, the films deposited by ELD may have relatively high extinction coefficients which result in relatively small changes in a film's thickness changing the film's transparency in a detectable manner. Because of this, differences in a film's thickness can result in differences to the resulting reflectivity measured by the one or more detectors and these detectable differences and changes be measured and used to determine a film's thickness.

For example, some cobalt films less than about 10 nm may be semi-transparent to various wavelengths of light, such as between about 615 nm and 650 nm. When these films are deposited on top of another metal, such as copper, changes to the cobalt film's thickness may result in detectable changes to some wavelengths of light reflected by the underlying copper. FIG. 3A depicts illustrations of deposited film appearance and FIG. 3B depicts a graph of film thickness versus light transmittance. The top portion of FIG. 3A includes a first material 340, shown in white, deposited on top of a second material 342, shown in black. The first material 340 may have a high extinction coefficient such that it is partially transparent to some wavelengths and as its thickness decreases, the second material 342 underneath is more visible and conversely, as the first material 340 thickness increases, it becomes less transparent. As further illustrated in the graph of FIG. 38, the light transmittance of the first material 340 decreases as its thickness increases. These detectable changes can be measured and used to determine corresponding film thickness.

Other metals and films that may be suitable to the detections and determinations using the optical metrology module described herein may exhibit similar film transparency changes correlated with thickness changes, such as having high extinction coefficients, including cobalt, copper, nickel, tungsten, tin, silver, gold, ruthenium, molybdenum, titanium, tantalum, and/or oxides, nitrides, and/or various alloys of these metals. In some embodiments, other film factors or characteristics that are detectable and measurable by the techniques and apparatuses herein may also include film roughness or surface oxide thickness. In some embodiments, the reflectivity of the interface and/or material underlying the top layer may also affect the detectability of optical signals and determinations provided herein. For example, the interface and/or material underlying the top layer may affect the optical signals that are reflected off the underlying layer or layers of material. Because of this, some embodiments may have an interface between the top layer of material and the underlying material and/or may have an underlying material that has reflectivity.

In addition to the optical metrology module described herein, the tool may include other metrology or process control elements. For example, there may be one or more aspects or modules for characterizing the electroplating or electroless plating bath, including for measuring the pH, absorption, Raman spectra, etc. of the liquid electrolyte.

In some embodiments, the semiconductor processing tool may be configured to perform one or more other processing operations, such as electroplating, deposition with physical vapor deposition (PVD) or chemical vapor deposition (CVD), which may include plasma-assisted deposition including atomic layer deposition (ALD), or etching, including atomic layer etching (ALE). The optical metrology module may be integrated into any of the tools that perform any of these processing operations in order to measure and determine a thickness of a material on a wafer that will be or has been processed by the tool. Various tool architectures are provided below.

Integrating a tool with an optical metrology module described herein may enable in-line monitoring of multiple wafers in the batch of wafers processed by the tool. This monitoring may include estimating and monitoring a film's thickness and/or non-uniformity before and after processing, and/or to optionally provide feedback to the processing module to flag unacceptable thickness, uniformity drift, or other film properties, fault events, or adjust process parameters to compensate for any of the detections.

Optical Metrology Modules

The optical metrology module may be configured in various manners. In some embodiments, the optical metrology module includes one or more detectors configured to detect one or more wavelengths of light and/or wavelength ranges of light, which may include those in and/or outside the visible spectrum, a movement mechanism configured to cause relative motion between a substrate and at least one detector, and optionally, one or more illumination sources. The optical metrology module may also include control logic, computational logic, or electronics for processing the optical signals from the one or more detectors, determining a film thickness on the substrate, and/or determining one or more adjustments to a tool or a process performed in the tool based on the signals from the one or more detectors.

As provided above, the at least partial transparency of some deposited films allows some light to pass through the film, interact with the material underneath the film, reflect off this underlying material, and be detected by the one or more detectors. This reflected light or wavelengths received by the one or more detectors maybe interpreted as signals, which may be referred to herein as optical data or measured optical data, which may be used to determine a film thickness on the substrate, one or more properties of a film (such as RI or surface roughness), and/or one or more adjustments to a tool or a process performed in the tool. Referring back to FIGS. 3A and 3B, as the thickness of the top first material 340 varies, its transparency changes, which in turn may change the reflection of light that passes through the first material 340 and reflects off the second material 342 underneath the first material 340. For some wavelengths of light, these variations of the reflected light may be detected and correlated, or otherwise associated, with different thicknesses of the top layer of material as described herein in order to determine the measured film's thickness or other property.

The one or more illumination sources may be configured to emit various wavelengths of visible and/or non-visible light. The visible range of light generally has wavelengths between about 380 nm and 740 nm; the non-visible light outside this range can include infrared and radio waves at larger wavelengths (e.g., infrared is between about 700 nm to about 1 millimeter (mm)) and can include ultraviolet (e.g., between about 100 nm and 400 nm) at smaller wavelengths. The one or more illumination sources may therefore include, for example, white light or other broad spectrum of light. In some embodiments, the light may be ambient lighting provided by a fabrication facility which may be, in some instances, a white light or combination of multiple visible wavelengths of light. The one or more illumination sources may also include a non-broadband source such as a non-white light source that is, instead, comprised of two or more sources at distinct wavelengths or distinct ranges of wavelengths. In some implementations, the one or more illumination sources may include light outside the visible range which may be used alone or in conjunction with light in the visible range. Additionally, some embodiments may use solar radiation to illuminate the substrate which may include a combination of ultraviolet and visible light, for example.

Figure 4:
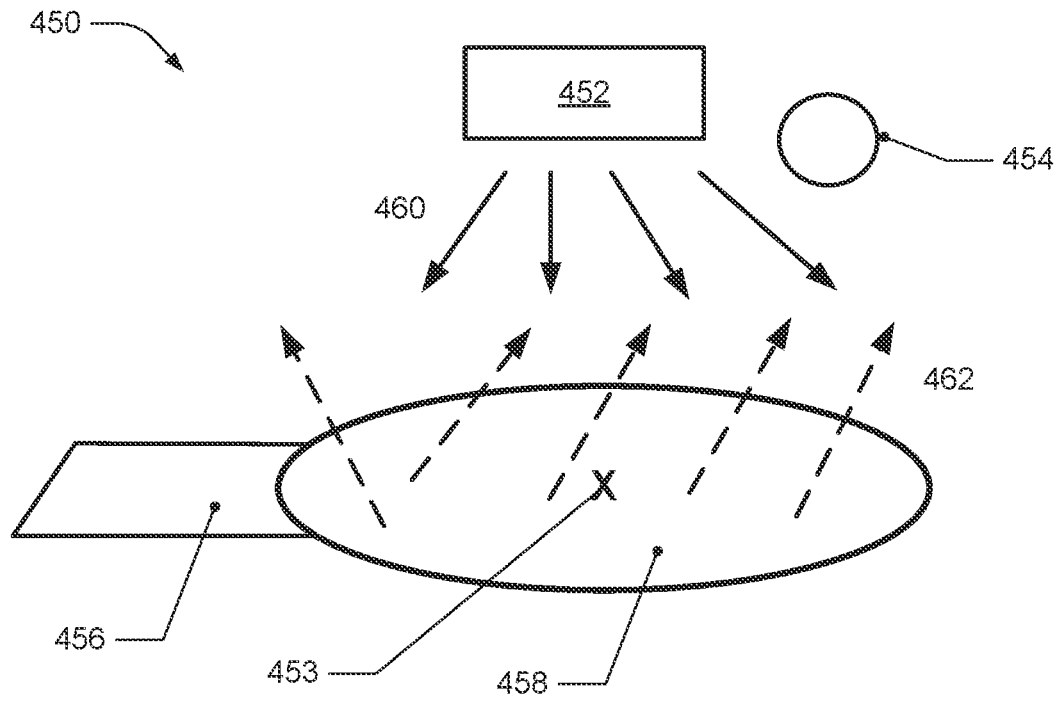
FIG. 4 depicts an example optical metrology module according to disclosed embodiments.

In some embodiments, the one or more illuminations sources are configured to emit light onto the entire wafer, including the entire top surface of the wafer. FIG. 4 depicts an example optical metrology module according to disclosed embodiments. Here, the optical metrology module 450 includes an illumination source 452 and one or more detectors 454 which is represented by a single circle. Although only a single circle is shown, some embodiments may include more than one detector or a dense array of detectors such as imaging sensor 454. The optical metrology module 450 may also include a movement mechanism 456 configured to cause relative motion between a substrate 458 and the one or more detectors 454. This relative movement may be movement of the substrate 458 relative to one or more detectors that are stationary, movement of the one or more detectors 454 relative to the substrate 458 that is stationary, or movement of both the one or more detectors 454 and the substrate 458. As also shown here, the illumination source 452 is configured to emit light 460 onto the entire substrate 458 and the one or more detectors 454 are configured to detect the light 462 reflected off the substrate 458 (illustrated with dashed lines). This emission of light may be considered diffuse.

Additionally, or alternatively, the one or more illuminations sources may be configured to illuminate a spot or area on the substrate. For example, in some embodiments, the one or more illuminations sources is configured to illuminate a spot on the wafer have a diameter or area from the micron level (e.g., 0.5, 1, 10, or 100 microns), to the millimeter level (e.g., 0.5, 1, 10, or 100 mm), to a centimeter level (e.g., 1, 2, 3, or 5 cm), or to tens of centimeter levels (e.g., 10 or 50 cm).

Figure 5:
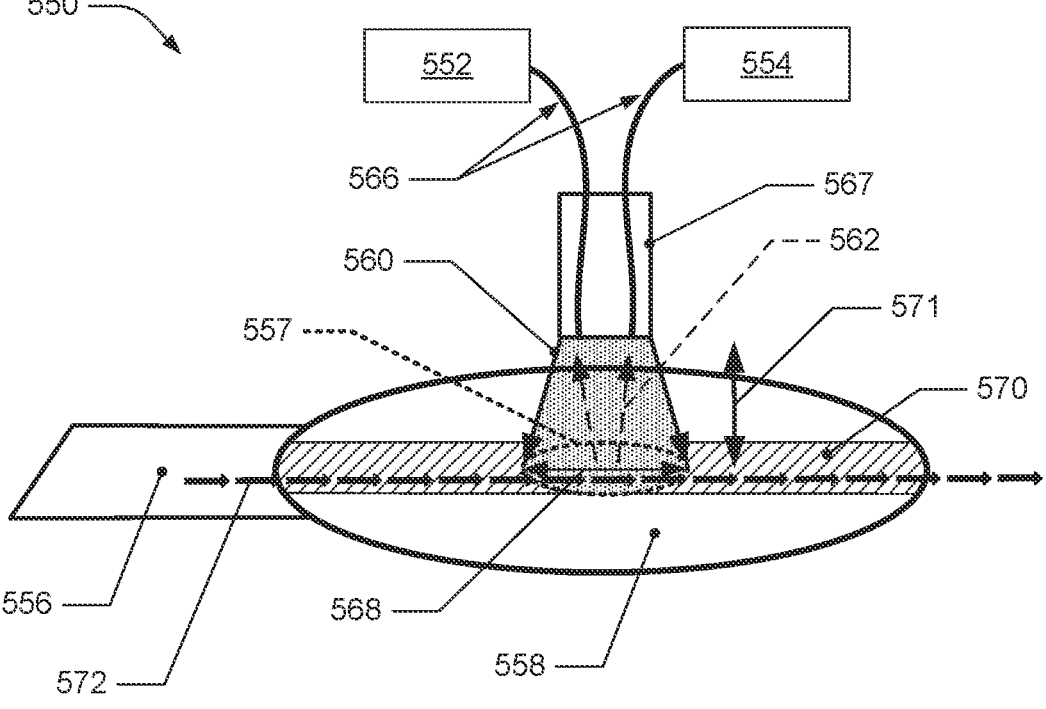
FIG. 5 depicts another example optical metrology module according to disclosed embodiments.

FIG. 5 depicts another example optical metrology module according to disclosed embodiments. Here, the optical metrology module 550 includes an illumination source 552 configured to illuminate a spot 557 on the substrate 558 and one or more detectors 554, both of which may be connected through fiberoptic cables 566 to a probe 567 that is positioned such that it can emit light 560 onto, and receive light 562 reflected off, the substrate 558. The probe 567 in some such embodiments includes one or more ports for emitting light and one or more ports for receiving the reflected light. In some implementations, the one or more detectors and the illumination source may be positioned in the same housing or probe.

Here in FIG. 5, the illumination source 552 emits light 560 that passes through fiberoptic cable 566, out the probe 567, and onto the spot 557 of the substrate 558, with the spot 557 having a diameter 568 and being illustrated as a circle (the spot 557 and the light emitted from the probe 567 are highlighted with shading; the spot is also illustrated with a dotted boundary). As provided above, this spot may be various sizes, such as having a diameter at the micron level, millimeter level, centimeter level, or tens of centimeter level. In some embodiments, this emission of light may be considered collimated light. Similar to FIG. 4, the movement mechanism 556 is configured to cause relative motion between the substrate 558 and the one or more detectors 554. The one or more detectors 554 in FIG. 5 are configured to detect the light 562 reflected off the substrate 558 (illustrated with dashed arrows).

Figure 6:
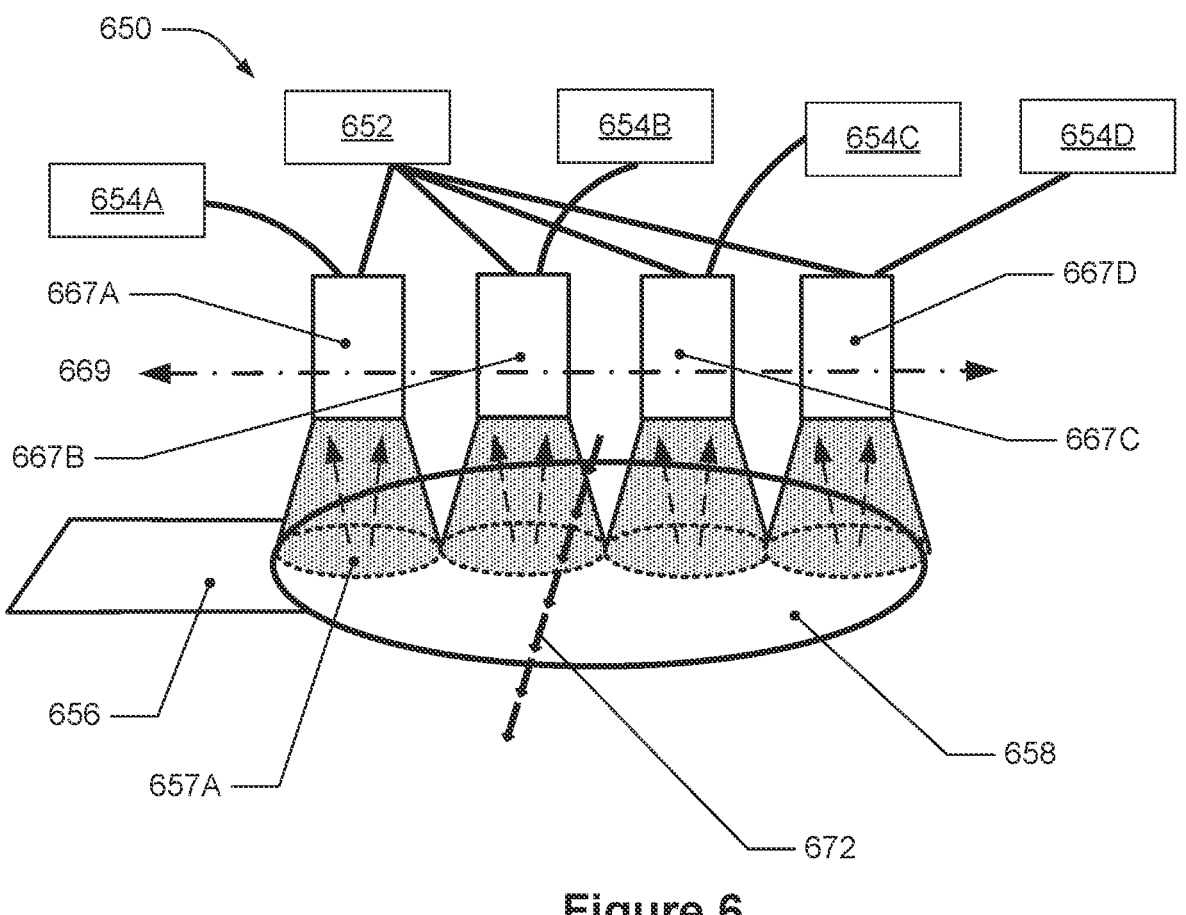
FIG. 6 depicts yet another example optical metrology module according to disclosed embodiments.

Some embodiments of the optical metrology module employ multiple illumination sources. These sources may be arranged as linearly separated elements, i.e., along the line, or elements arranged in the geometric pattern such as a circle, square, rectangle, or other patterns. FIG. 6 depicts yet another example optical metrology module according to disclosed embodiments. Here, the optical metrology module 650 includes multiple probes 667 arranged along a line 669 and that are each configured to illuminate spots on the substrate 658. In some instances, each probe 667 may be connected to separate, independent illumination sources such as various lamps, while in some instances each probe may be connected, such as via fiberoptic cable in FIG. 6, to a single illumination source 652. In some of these instances, the probes may be considered as multiple illumination sources. As illustrated in FIG. 6, in some embodiments, each probe 667A-D may have a separate corresponding detector 654A-D. In some other embodiments, each probe 667A-D may be connected to a single detector (not illustrated).

Certain implementations employ multiple illumination sources, particularly embodiments having multiple detectors. In some such implementations, as illustrated in FIG. 6, there may be a one-to-one correspondence between sources and detectors, with the detectors arranged to capture the separate signal generated by the separate illumination sources on the wafer surface. For instance, in FIG. 6, detector 654A is configured to receive and capture the emitted by probe 667A in the spot 657A and reflected off the wafer 658.

The one or more detectors described herein may each include one or more detection elements, such as an electronic image sensor which may include a charge-coupled device (CCD), and an active-pixel sensor (sometimes referred to as a complementary metal-oxide-semiconductor sensor or a "CMOS" sensor), or a photomultiplier tube (PMT), for example. Some such image sensors detect and convey information used to make an image by converting a variable attenuation of light waves into signals, such as impulses of current that convey the information. In some embodiments, the detector is an imaging device such as a multi-pixel device, which may be a camera. Each pixel of the imaging device may capture one, two, three, or more wavelengths or ranges of like wavelengths. One example is a camera that has a first detection element for red, a second detection element for green, and a third detection element for blue, which are all associated with a single pixel or other spatial element.

In some embodiments which use a broadband detector, e.g., a detector configured to detect multiple wavelengths, a spectrometer may also be used to capture and measure intensity at multiple different wavelengths, such as continuously over many wavelengths in the visible, IR, and/or UV range.

In some multi-pixel embodiments such as embodiments employing camera sensors, there may be ranges of numbers of pixels, such as at least about 1000 pixels, tens of thousands of pixels, or millions of pixels that are present in a conventional camera sensor. In some embodiments, an off-the-shelf camera or a slightly modified version of such camera may be employed, such as a conventional digital camera such as a digital single-lens reflex (DSLR) camera.

In some embodiments, each detector may be configured to detect one or more color signals of the visible range. This may include red wavelengths, or ranges of such red wavelengths, such as between about 625 nm and 740 nm, blue wavelengths, or ranges of such blue wavelengths, such as between about 450 nm and 485 nm, or green wavelengths, or ranges of such green wavelengths, such as between about 500 nm and 565 nm.

Referring back to the movement mechanism, it may be configured to move the substrate relative to the one or more detectors, move the one or more detectors with respect to the substrate, and/or move the one or more illumination sources with respect to the substrate. This movement enables various areas of the wafer to be illuminated and detected by the one or more detectors. This movement may also take various shapes and types, such as linear or rotational movement, or patterned movement in a spiral, serpentine, circle, or square, shape, for example. In some embodiments, the movement mechanism is configured to move the wafer and this mechanism may be a wafer positioning mechanism, such as a wafer handling robot that is configured to pick up, hold, rotate, transfer, and/or place a wafer, or an element configured to rotate the wafer about an axis. This may include the hand-off robot 148 in FIG. 1. The movement mechanism may also be configured to move the wafer in various movement sequences, such as linear, curved, rotational, or a pattern, such as a serpentine. Relative movement between the wafer, the one or more detectors, and/or the one or more illumination sources enables the illumination and detection of areas on the wafer, including the whole face of the wafer or along various shapes, such as a line or other pattern.

For example, referring back to FIG. 5, the movement mechanism 556 may cause relative motion between the substrate 558 and the probe 567 in a line of motion 572, as indicated by the line of arrows, in order for the illumination source 552 to illuminate an area 570, illustrated with cross-hatching, and for the detector 554 to receive light reflected from the substrate 558 in this area 570. As mentioned above, the movement mechanism 556 may move the substrate 558 while the probe 567 remains stationary, may move the probe 567 while the substrate 558 remains stationary, or may move both the substrate and the probe in a choreographed manner. As also seen in FIG. 5, the relative movement between the substrate 558 and the probe 567 enables the scanning and detection of areas on the substrate 558 that are larger than the illumination and detection area of the illumination source 552 and detector 554.

Figures 7A, 7B, 7C, 7D:
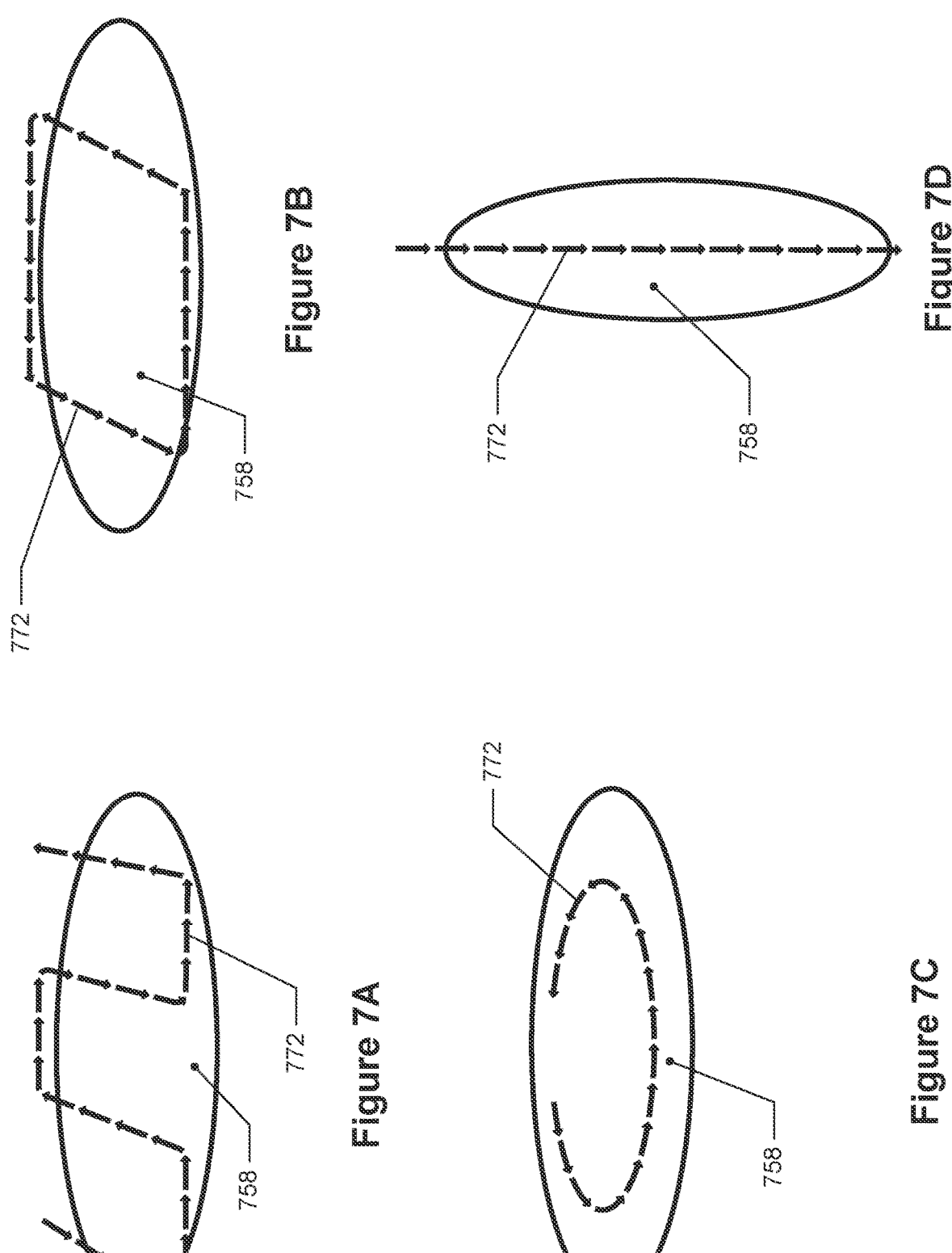
FIGS. 7A through 7D depict four examples of possible movements of the movement mechanism.

FIGS. 7A through 7D depict four examples of possible movements of the movement mechanism. In FIG. 7A, the movement 772 is a serpentine or back and forth movement, in FIG. 78 the movement 772 is a geometric shape such as a rectangle or square, in FIG. 7C the movement is rotational which may be circular or spiral, for instance, and in FIG. 7D the substrate is at a vertical orientation the movement is vertical; this vertical movement may be linear or any another shape described herein.

These movements may be between a substrate, one or more illumination sources, and/or one or more detectors. For example, these movements may be between a single probe as seen in FIG. 5 and the substrate, or they may be between multiple probes as seen in FIG. 6 and the substrate. In FIG. 6, a single linear motion 672 between the plurality of probes 667A-D and the substrate 658 enables the whole surface of the substrate 658 to be illuminated and detected.

In some embodiments, when a camera is used as a detector, it may take an image of the entire wafer in one image capture operation. In some embodiments, a camera may be configured such that it captures an image of only a portion of the wafer. In such cases, the single image of a single portion of the wafer may be sufficient to capture the necessary information for use in the measurements and/or determinations provided herein. In other embodiments, multiple images are captured over the face of the wafer by moving the wafer and/or the camera with respect to the wafer. These movements may be performed in any manner described herein.

The orientations of the substrate, one or more illumination sources, and/or the one or more detectors may vary. In some implementations, the one or more illumination sources may be positioned over a center or center region of the substrate while the one or more detectors is oriented at an angle with respect to the center or center region. For example, referring back to FIG. 4, the illumination source 452 is positioned over the center 453, or center region, of the substrate 458 while the detector 454 is oriented at an angle to the center 453. In some implementations that use a probe which includes the ability to both emit and receive light, the probe may have ports configured to emit the light that are arranged radially outwards from the center of the probe and may have a receiver in the center of the probe.

In some of the embodiments that illuminate a spot on the wafer, the area of this spot may vary as provided above. This may include, for instance, an area of between about 0.5 cm and 4 cm. In some embodiments, the area of the spot may vary based on a separation distance between the illumination source and the substrate. Referring back to FIG. 5, the probe 567 is offset from the substrate 558 by a first distance 571. As the first distance 571 increases, the area of the illuminated spot 557 may also increase and conversely, as the first distance 571 decreases, the spots' 557 area may also decrease. In some embodiments, this distance may affect the noise or other light received by the detector such that more noise or other light may be received as the distance increases.

Figure 8:
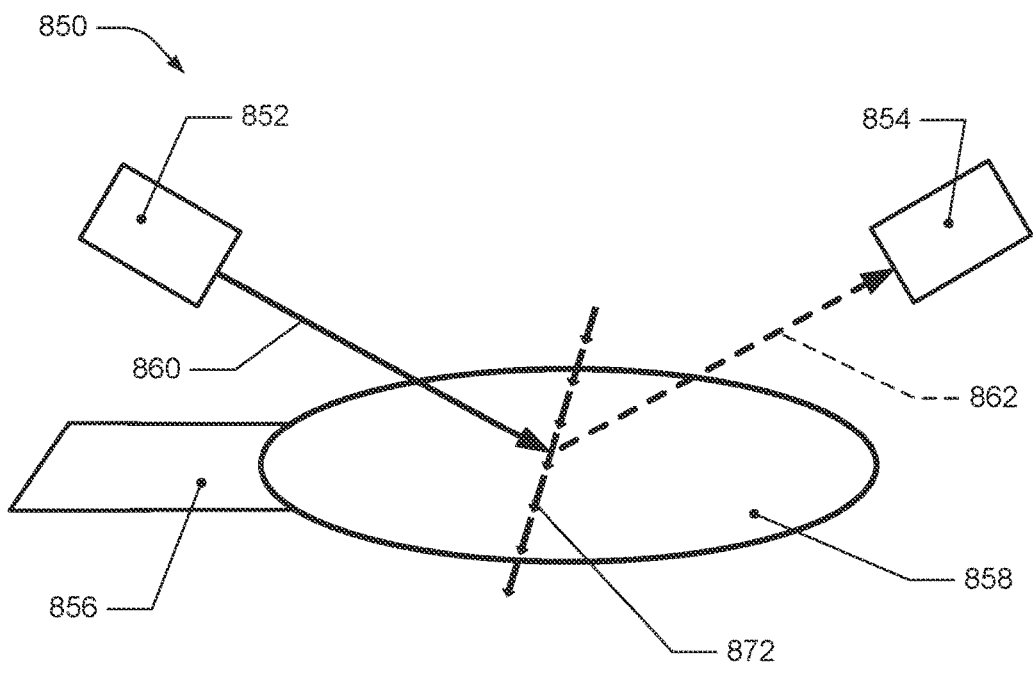
FIG. 8 depicts an example optical metrology module according to disclosed embodiments.

Similar to provided above in FIG. 4, some implementations may use one or more detectors and one or more illumination sources that are separate from each other and that may be oriented at one or more angles to the substrate. This may include, for example, a light emitting probe and a separate light receiving probe that are oriented at one or more angles to the substrate. The light receiving probe may be configured to receive light emitting by the other probe and reflected off the substrate. FIG. 8 depicts an example optical metrology module according to disclosed embodiments. Here, the optical metrology module 850 includes a first probe 852, which may be considered an illumination source, that is configured to emit light 860 onto the substrate 858, and the second probe 854, which is a detector, is configured to receive and detect the light 862 reflected off the substrate 858. In some such embodiments, liked depicted in FIG. 8, the emitted light 860 may be collimated light, the first probe 852 (illumination source) is configured to emit the collimated light, and the second probe 854 (the detector) is configured to receive and detect the reflected collimated light. The substrate 858, the illumination source 852, and/or the detector 854 may be moved in any manner described herein, such as moving the substrate 858 along the direction of movement 872 while the illumination source 852 and the detector 854 remain stationary.

Arranging the illumination source and detector separately may be advantageous in various instances, such as when the tool geometry or processing conditions prevent, or make it unfeasible for, installing an illumination source and/or probe in close proximity to the wafer, such as the arrangements shown in FIGS. 5 and 6. For example, the physical geometry and/or movement mechanism may prevent an illumination source and/or detector from being positioned close enough to the substrate to take suitable measurements. In another example, the process conditions, such as the temperature, pressure, or the presence of chemically corrosive elements, may prevent the illumination source and/or detector from being positioned within the same environment as the wafer and/or close enough to take suitable measurements. Many probes, detectors, and illumination sources cannot withstand the operating temperatures, pressures, or exposure to some of the chemical species used in semiconductor processing operations.

Figure 9:
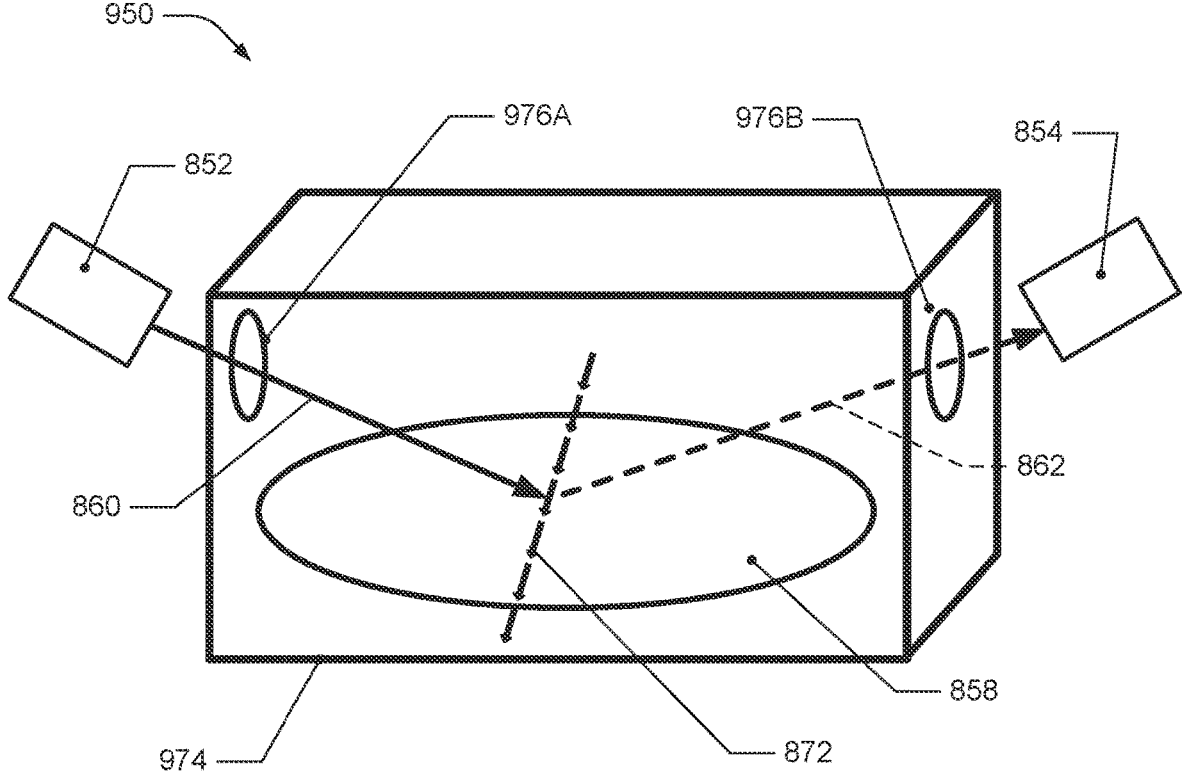
FIG. 9 depicts another example optical metrology module according to disclosed embodiments.

Because of this, some embodiments may advantageously position the illumination source and/or detector outside an environment in which the wafer is positioned. FIG. 9 depicts another example optical metrology module according to disclosed embodiments. This example is similar to FIG. 8, with the optical metrology module 950 including the first probe 852 configured to emit light 860 onto the substrate 858, and the second probe 854 to receive and detect the light 862 reflected off the substrate 858, but here these two probes are positioned outside the environment 974 in which the substrate 858 is positioned. The environment may be, in some instances, an aspect of the tool such as a load lock, wafer transfer chamber, equipment front end module, vacuum chamber, processing chamber. The environment 974 may include one or more windows or ports for the light to be emitted into and reflected out of the environment 974. As illustrated, emitted light 860 is configured to pass through a first port 976A and onto the substrate 858, and reflected light 862 is configured to pass through a second port 976B to the detector 854. These ports may have one or more transparent or semi-transparent protective surfaces, such as a window made of quartz and/or sapphire for instance, that allows light to be transmitted into and out of the environment 974.

Figure 10:
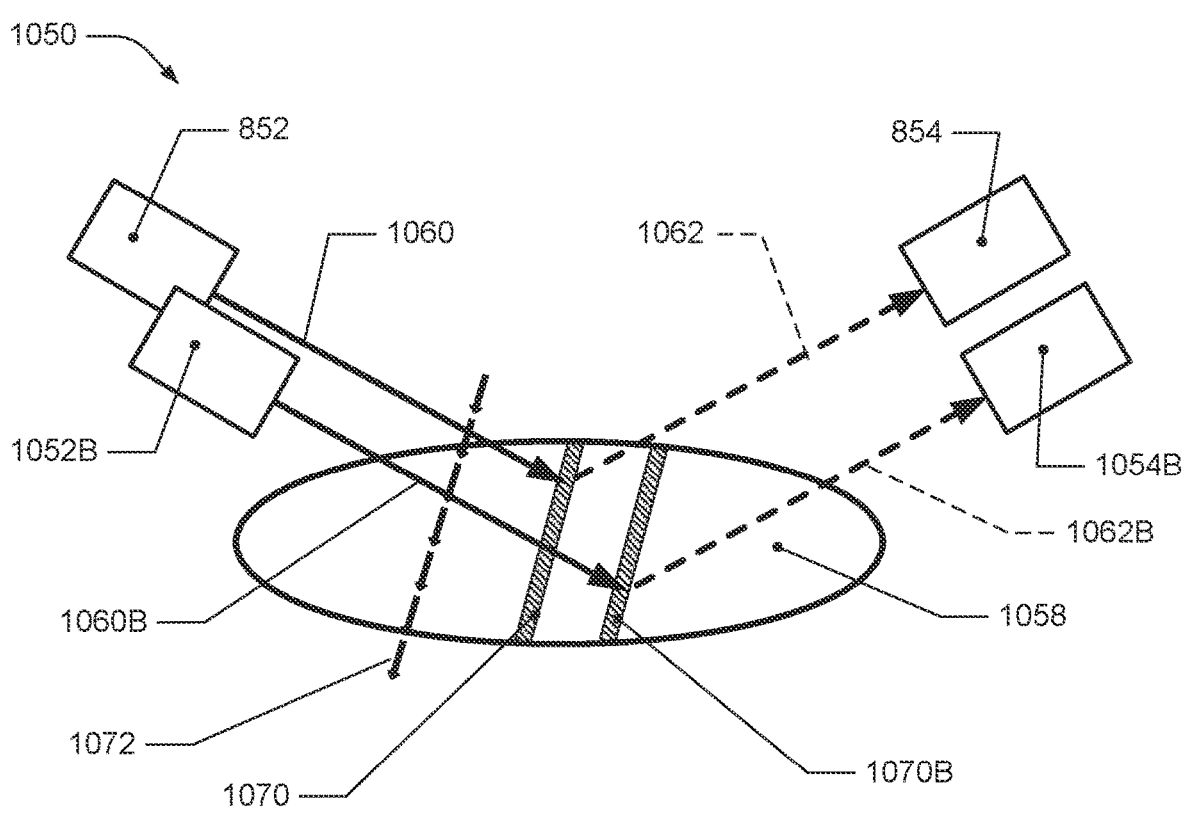
FIG. 10 depicts yet another example optical metrology module according to disclosed embodiments.

Although one illumination source and one detector are shown in FIGS. 8 and 9, some embodiments may include a plurality of illumination sources and/or a plurality of detectors. These sources and/or detectors may be positioned to illuminate and measure different spots of the wafer, similar to FIG. 6. FIG. 10 depicts yet another example optical metrology module according to disclosed embodiments. Here, the optical metrology module 1050 includes a plurality of illumination sources and a plurality of detectors. This module 1050 includes the same first probe 852 and second probe 854 of FIG. 8, but also includes a second illumination source 1052B configured to emit light 1060B and a second detector 1054B configured to receive and detect the light 1062B reflected off the substrate 1058. As with FIG. 8, this emitted light 1060 and 1060B may be collimated light in some embodiments. This second illumination source 1052B and the second detector 1054B may be the same as the other illumination source and detector, respectively. By causing relative movement along the line of motion 1072 (or any other movement pattern described herein) between the substrate 1058, illumination sources 852 and 1052B, and/or the detectors 854 and 1054B, separate regions 1070 and 1070B of the substrate 1058 are illuminated and detected. This allows multiple regions of the substrate to be scanned.

Figure 11:
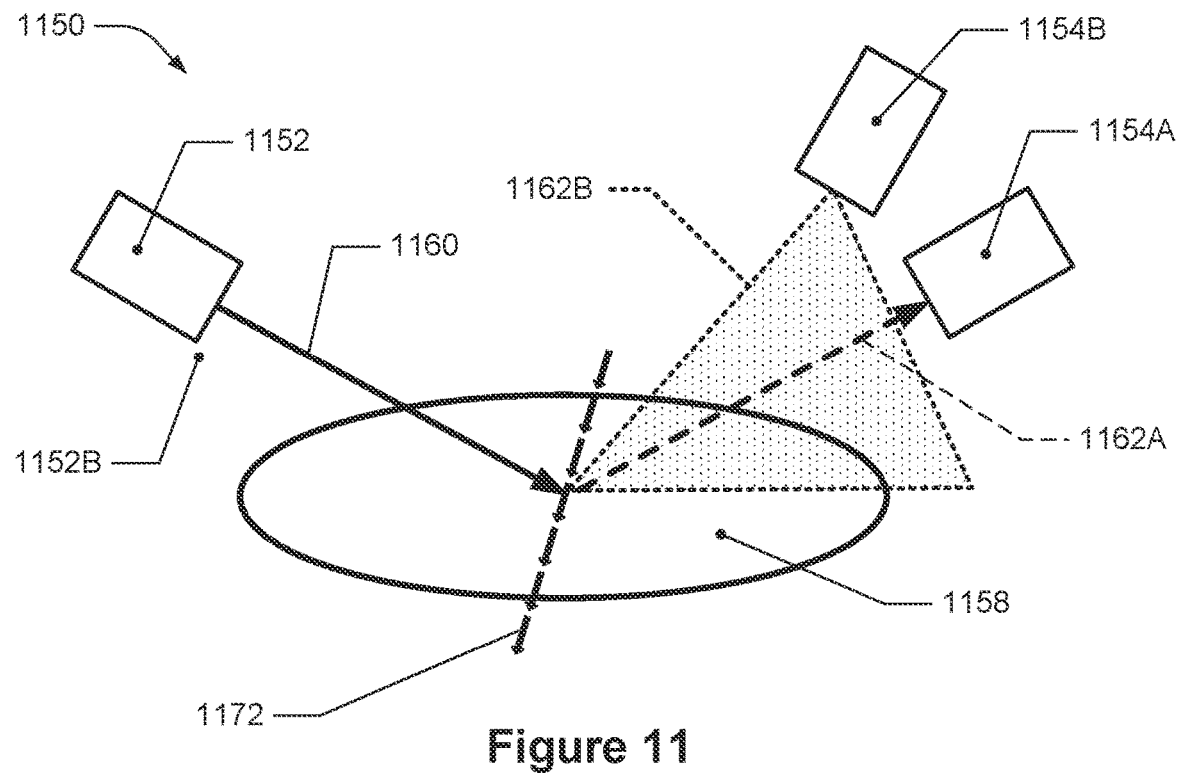
FIG. 11 depicts an example optical metrology module according to disclosed embodiments.

In some embodiments, the optical metrology module may include more detectors than illumination sources. This may include, for example, multiple detectors configured to detect different light characteristics. In some implementations, one detector may be configured to receive and detect a specularly-reflected collimated light beam, and a second detector may be configured to receive and detect diffusely-reflected light. FIG. 11 depicts an example optical metrology module according to disclosed embodiments. Here, the optical metrology module 1150 includes an illumination source 1152 that is configured to emit light 1160 onto the substrate 1158, such as collimated light, and a plurality of detectors. A first detector 1154A is configured to detect the specularly-reflected collimated light beam 1162A, and a second detector 1154B is configured to detect diffusely-reflected light 11628. In some implementations, detecting both the specularly-reflected collimated light and the diffusely-reflected light enables the determination of a surface roughness on the substrate 1158. This determination may be made, at least in part, by detecting and determining a differential in the amount of specular versus diffuse scattered light, which changes as a function of film roughness. As described below, these measured values may be compared or otherwise associated with known values of calibration data, target data, or test values in order to determine a measured film roughness.

In addition to monitoring film reflectivity to determine film thickness of a metal film, some embodiments of the optical metrology module are configured to determine a change in other film properties such as the film density, roughness, and/or index of refraction (RI) by monitoring, for example, the intensity, polarization, and/or attenuation of reflected light and/or shape of reflected spectra. In view of all the examples contained herein referring to the monitoring of reflectivity to determine film thickness, it should be understood that the same principles can be extended to the monitoring of light scattering, diffraction, polarization, and/or attenuation to determine other film properties, and these should be considered as other specific applications covered by this disclosure. For example, if a drift or sudden shift in some processing module parameter resulted in an increase in roughness, and the one or more detectors were positioned in manner to detect some differential in specular versus diffuse scattered light, then this implementation is configured to monitor and determine film roughness and/or facilitate automatic control of some process parameter to minimize film roughness or match to a desired level of film roughness.

As noted herein, the optical metrology module is not limited to detecting and/or analyzing only the visible range of light; wavelengths of light that are much shorter or longer than the visible range may be used.

Process Control Examples

Figure 12:
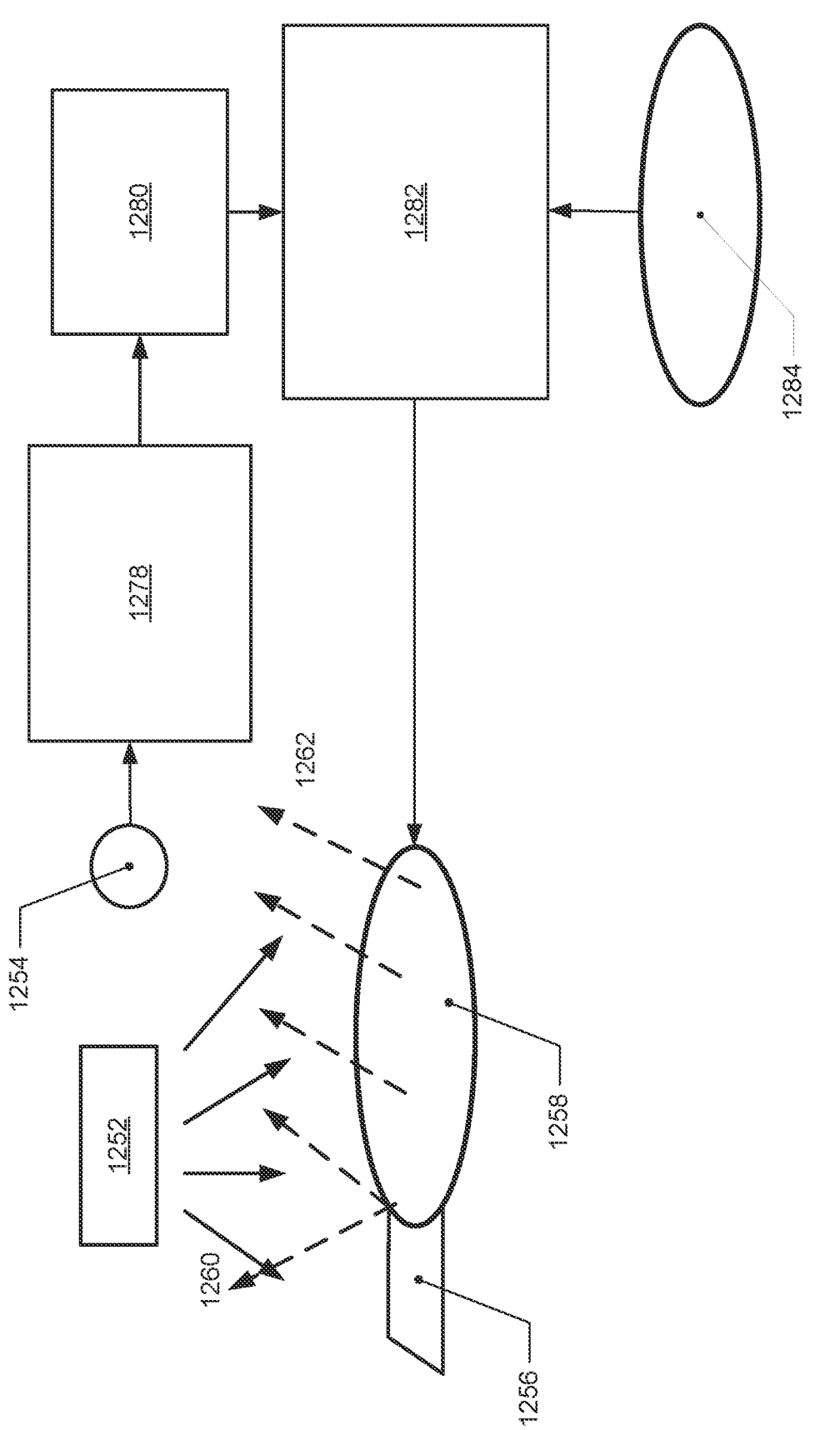
FIG. 12 depicts a block diagram of subsystems and/or information that may be used to implement certain automated process control adjustments.

The optical information collected by the optical metrology module may be used for various feedback and/or feedforward process controls of the tools provided herein. FIG. 12 depicts a block diagram of subsystems and/or information that may be used to implement certain automated process control adjustments. This FIG. 12 includes the optical metrology module aspects of FIG. 4 which has the wafer movement mechanism 1256, an illumination source 1252, and one or more detectors 1254 which is represented as a single detector. Although these specific aspects are illustrated in this Figure, any of the optical metrology modules may be used in such process controls. In FIG. 12, the optical metrology module is configured to illuminate a post-processed wafer 1258 (or in some instances a wafer partially processed by the processing chamber 1282), capture reflected light data from the wafer 1258, and transmit the captured data to the control logic 1278. The control logic 1278 may be configured to interpret the received data, make one or more determinations as to one or more wafer properties, and/or potentially make one or more adjustments to the processing parameters 1280 for a processing operation performed in the processing chamber 1282 on a subsequent wafer 1284. In some embodiments, this depicted control loop may be considered a feedback loop in which the optical metrology module captures data from a post-processed wafer 1258 which is used to make adjustments to processing conditions or parameters on a subsequently processed wafer 1284.

In some embodiments, the control loop may be a feedforward control loop in which the optical metrology module captures data from the wafer 1258 before performing processing on this wafer 1258 in the processing chamber 1282 and, in response to this captured data, adjustments may be made to the processing conditions or parameters for this wafer 1258. Schematically, using FIG. 12, the arrow between the wafer 1258 and the processing chamber 1282 may be reversed and the second wafer may not be depicted.

In order to utilize the measured or detected optical signals, the optical data measured and gathered from a wafer may be converted to thickness values, film properties, and/or process control values in various manners. This may include applying these measured optical signals to a relationship between a film property, such as film thickness, and received optical signals for one or more wavelengths. In some embodiments, the optical data measured and gathered from a wafer may be converted to thickness values, film properties, and/or process control values using a model that can take many forms and in some instances may be generally described as a "transfer function". In some such embodiments, a metric is generated that is associated with a property of the deposited material on the wafer, and this generating may be accomplished by applying the gathered optical data to the transfer function which relates the optical data to the metric.

This transfer function may take optical data as an input and may provide, in some instances, a layer thickness, information related to other film properties (e.g., RI or surface roughness), process control information, or a surrogate for layer or process control information. This output information may be considered the transfer function generating a metric associated with the property of the material, such as generating a numerical value (the metric) of a measured film's thickness (the property). In some implementations, the transfer function may include a machine learning model that is trained to analyze optical data of a wafer as an input to determine a layer thickness, information related to other film properties (e.g., refractive index "RI", or surface roughness), process control information, or a surrogate for layer or process control information for that wafer. As will be discussed further below, a machine learning model may be first trained using a training set comprising optical data, process parameters, and/or post-processed features for a number of wafers to determine how processing parameters may affect a wafer having some optical data. In some embodiments, the machine learning model may only consider certain processing parameters, i.e., a subset of all process parameters, and will output changes to less than all processing parameters.

In some embodiments, the transfer function may compare the detected optical signal against the signal of the target thickness and provide a difference. This may include, for example, the reflectivity signal or converted thickness signal of the wafer being measured is compared to a target reflectivity or thickness. This may be a signal of the whole wafer or a region on the wafer as provided above. A positive or negative difference between the signal from the wafer under consideration and the signal of the target thickness may then be converted into information used to determine how to adjust the process conditions for the subsequent wafer. In some implementations, the difference between the measured and target data may be used to offset or scale a processing parameter and/or condition, which may include offsetting or scaling iteratively in order to match the next wafer's reflectivity or thickness more closely to target.

In some embodiments of processing broadband data, the model may average the reflected light magnitude over all or a portion of the broadband spectrum for which the light was captured. For example, the magnitude of a broadband spectrum having wavelengths between about 450 nm and 750 nm may be averaged of some or all of this spectrum.

Some implementations of the models may employ a mathematical expression or computational model to analyze the optical information. A simple mathematical expression may be linear, or a higher order polynomial expression such as summation of terms comprised of multiple measured optical parameters. As an example, some implementations use camera data, of a portion or all of a wafer, averaged over multiple neighboring pixels for each of three channels. In other words, each pixel or group of pixels provides three values: a red value, a green value, and a blue value. In some instances, noise associated with the values may be reduced by averaging over multiple pixels. For example, an image may output at least 2,000 pixels across the diameter of the wafer and to reduce noise, pixels in an area of about 50 by 50 pixels may be averaged to produce an averaged output of about 100 pixels across the diameter.

The averaged value over the pixels for each channel (red, green, and blue) may be multiplied by a coefficient, and the products of the coefficients and the averaged intensity values are summed to provide a value representing the thickness of the film on the wafer under consideration. For instance, such mathematical expression may be obtained using a regression technique. The regression technique for generating these coefficients may be viewed as a model training or model generation process. A simple regression technique may generate a simple linear model in which the measured intensity values (one for each channel in the case of a camera) are simply multiplied by corresponding coefficients. More complex approaches may use higher order polynomial terms in the mathematical expression. These higher order polynomial terms raise the detected intensity values for the different channels, assuming there are multiple channels, to a higher power such as squared, cubic, fourth order, etc. The transfer functions described herein may be any of the regressions provided herein. Additionally or alternatively to linear or polynomial approximations, other approaches may include numerical solutions of equations describing the dependency of measured values on film thickness.

Some implementations may employ more sophisticated approaches, such as neural networks, random forest models, etc. to determine a thickness based upon the measured values.

Figure 13A:
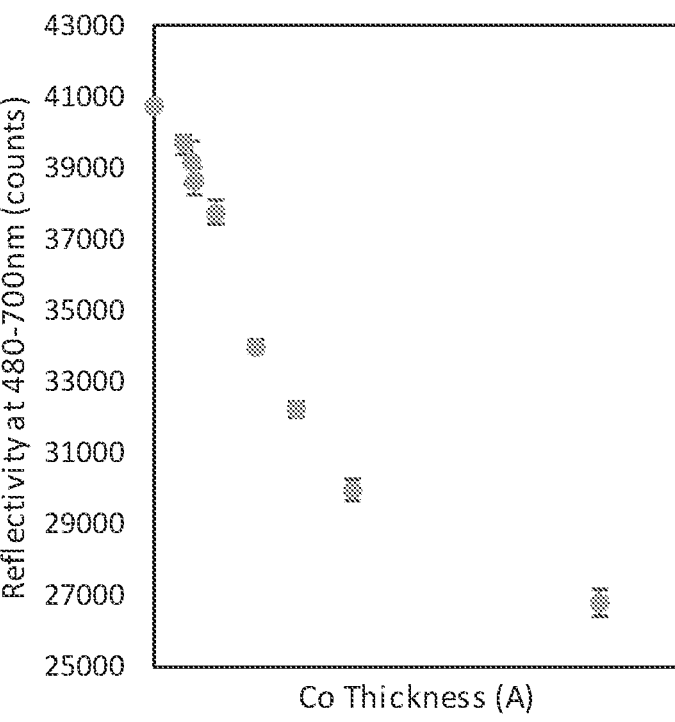
FIGS. 13A and 13B depict optical data gathered from two target wafers.
Figure 13B:
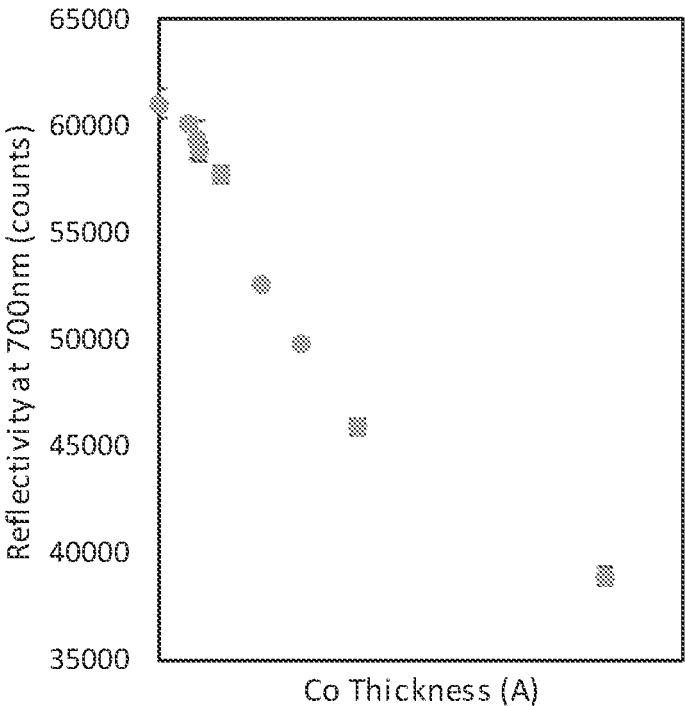

As an example, a mathematical expression or other computational model may be fit to or developed for gathered data which can then be used to process measured optical data and make any determination provided here, such as film thickness, surface roughness, density, or RI. FIGS. 13A and 13B depict optical data gathered from two target wafers. These Figures both have a horizontal axis with known thicknesses of cobalt deposited onto copper, and each Figure has different reflectivity data in the vertical axis. In FIG. 13A, the normalized reflectivity counts are shown for the averaged broad spectrum, such as over about 480 nm to about 700 nm, while in FIG. 13B, reflectivity signals at a specific wavelength, such as 700 nm, are shown. As can be seen, as the thickness of the top layer of metal increases, the reflectivity signal decreases. This detected data over wavelength ranges or specific wavelengths may be used to develop the relationship between known film properties and optical signals, which can then be used with detected signals from wafers of interest, such as measured data over the same wavelength ranges or specific wavelengths.

Figure 14A:
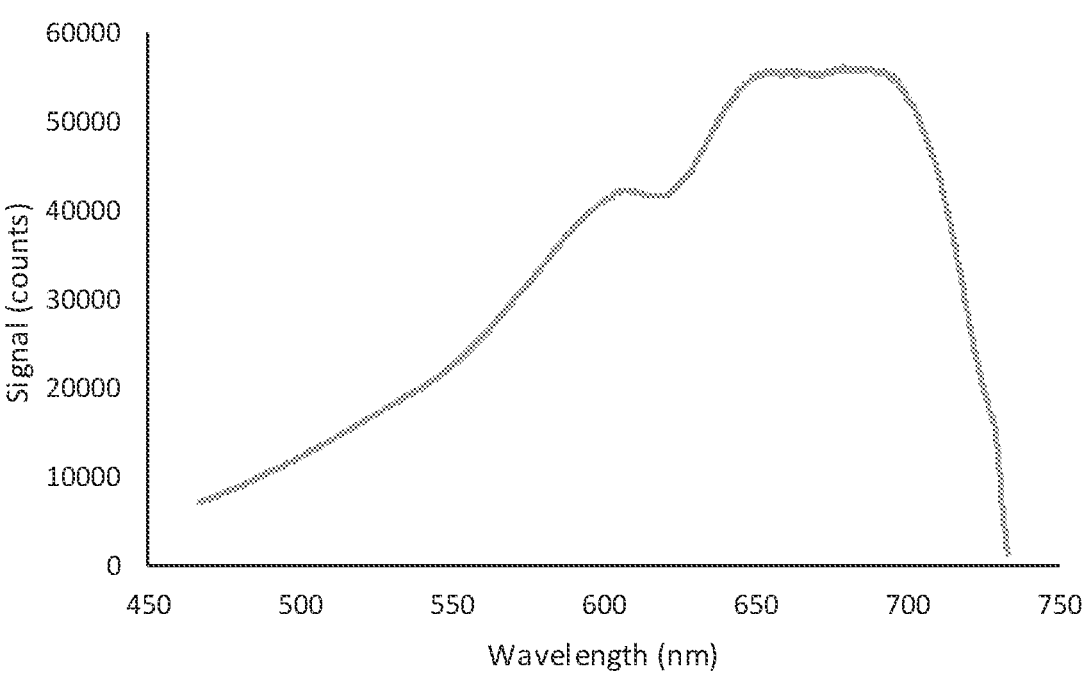
FIG. 14A depicts optical data gathered from a calibration wafer.
Figure 14B:
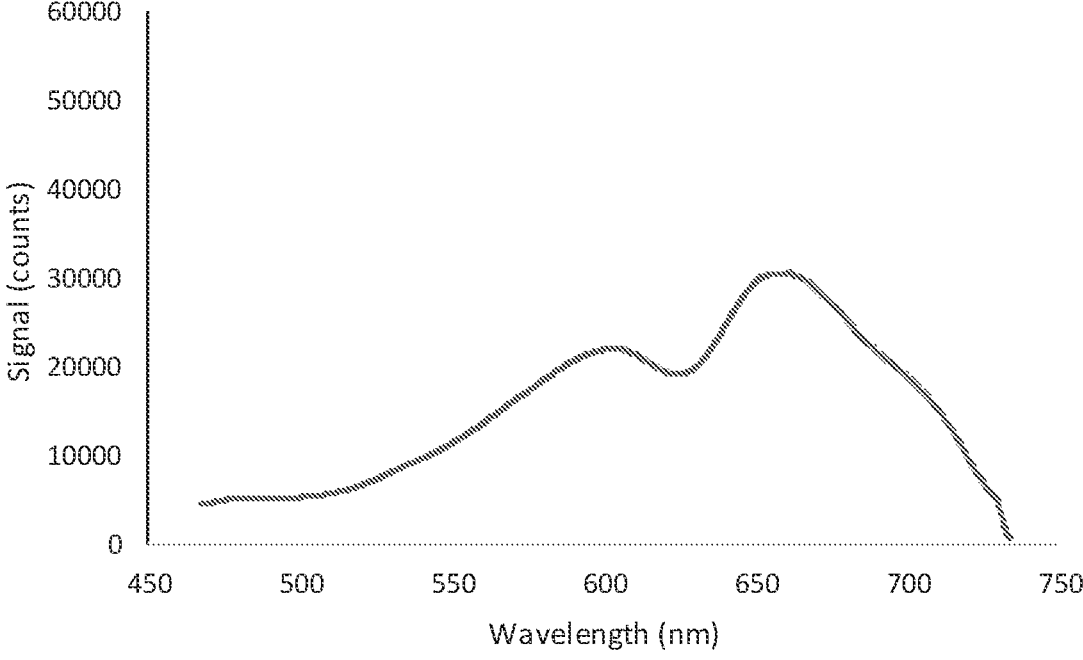
FIG. 14B depicts optical data gathered from a subject wafer.

As another example, measured optical data are illustrated in FIGS. 14A and 14B. FIG. 14A depicts optical data gathered from a calibration wafer and FIG. 14B depicts optical data gathered from a subject wafer. Both of these Figures have normalized signal counts on the vertical axis and wavelengths on the horizontal axis. In FIG. 14A, the broadband spectrum of a target non-patterned wafer having a cobalt film deposited onto of a copper layer of material is shown. In FIG. 14B, the broadband spectrum of a subject, patterned wafer having cobalt deposited onto areas of copper material is shown. The various models provided herein may use this data as described herein including, for example, to form a thickness versus reflectivity calibration curve. This may be considered, in some embodiments, using calibration data that may include target in such models and transfer functions.

The optical data measured and gathered from a wafer may be converted to thickness values, film properties, and/or process control values in various manners. As noted above, a machine learning model may be used to provide a processing parameter and/or processing condition that can be applied for a subsequent fabrication operation on a substrate. As described herein the processing parameter and/or processing condition may include, for example, deposition time, wafer temperature, sequencing and/or timing of solution dispensing locations, flow rate, chuck rotation speed, purge gas flow rate, RF power, e-beam power, chamber pressure, target position and orientation towards substrate, bias voltage or waveform, and/or substrate temperature, precursor or carrier gas flow rate.

In some embodiments, a machine learning model is trained using a set of training substrates. Each training substrate provides data for the training set. That data may include optical data, including data collected by any of the detectors provided herein such as a camera or spectrometer, collected from the substrate before a training fabrication operation, the spatial location (or site) from where the data is gathered, a target feature value for each spatial location, a processing parameter for the training fabrication operation, and/or optical data collected from the substrate after the training fabrication operation. Additional information, such as other processing parameters, may also be included in the data associated with each training substrate. In some embodiments, details of the technique used to collect the data are included in the data associated with each training substrate, such as the known thickness of the substrate when the optical data is collected.

Specific data may be adjusted between training substrates to provide a diverse data set for the machine learning model to train on. For example, the thickness of material on the wafer may be changed between otherwise similar training substrates. A machine learning model may then be able to determine the effect of the thickness as a processing parameter on a site of the substrate providing a specific optical signal.

Machine learning models may be trained using training sets. In accordance with various embodiments, a training set may have at least three components: pre-processed substrate feature information, post-processed substrate feature information, and processing parameters for a process of interest that converts the pre-processed substrate to the post-process substrate. In some cases, the pre-processed substrate feature information is optical data taken from a substrate or, particularly, a position on a substrate (or the whole wafer) prior to its being processed in the process of interest. In certain embodiments, the processing parameters for the process of interest may be any of those provided herein. The post-processed substrate feature information may be, for example, optical data of the processed substrate such as reflectivity of a fully spectra, individual wavelengths, and/or ranges of wavelengths. In some cases, the post-processed substrate feature information is an image taken of the post-processed substrate.

In certain embodiments, any given member of the training set is provided for a specific location or region on a substrate. For example, image data or other pre-processed substrate feature information may be taken at a particular location such as a region within a first die on the substrate. For this training set member, the post-processed feature information is taken from the same location. Further, to the extent that the processing parameters are localized at particular regions of the substrate, the processing parameter is provided at the particular location where the pre- and post-processing feature information is taken, in this case the particular location on the first die of the substrate.

In this approach, the training set members each contain three pieces of information for particular locations on the substrate. To provide a robust training set, training set members are provided for multiple regions of the substrate. And, when multiple training set members are provided for any given location on the substrate, the different training set members will have different process parameters and/or a different pre-processing feature information.

In certain embodiments, an initial, untrained neural network contains a random set of parameters to be trained or optimized during the training process. These parameters may include weights for connections between nodes or other components of the individual layers of the neural network or other modifiable aspects of the neural network architecture. Training may be conducted using any suitable optimization algorithm such as a stochastic gradient descent technique (e.g., "Adam: A Method for Stochastic Optimization," Kingma &. Ba, published as a conference paper at ICLR 2015, which is incorporated herein by reference in its entirety).

These transfer functions may be used in various ways. For example, FIGS. 15A and 15B depict two simplified techniques for processing the measured optical signals. In FIG. 15A, block 1501 receives the measured or detected optical signals as described herein. In block 1503, this received optical data (which may be considered first optical data) is applied to a transfer function, e.g., a relationship, in order to determine a measured film property, such as film thickness, density, roughness, RI, or non-uniformity. As described herein, in some embodiments, this transfer function may be based on a correlation or association between measured, known film property values and previously measured optical signals of test wafers. In block 1505, a determination is made about the determined film property. This determination may take various forms, such as whether the measured film property exceeds, or otherwise does not meet, a threshold. For instance, this determination may be whether a measured thickness exceeds a threshold, such as exceeding an acceptable thickness tolerance. This determination may also include determining a difference between the measured signals and signals associated with a target film property, such as a target film thickness. In some similar embodiments, the determination may include determining a difference between the measured signals in a center region and measured signals in an edge region of the same wafer. This may include the measured optical data having a first subset associated with the interior region and a second subset associated with the edge region. In some instances, the determination may compare measured signals of a wafer interior region to signals associated with a target film property in the wafer interior region.

In FIG. 15B, block 1507 is the same as block 1501. In block 1509, the application of the measured or detected optical signals to the transfer function may return a difference between these measured optical signals and target optical signals of a film property. These target optical signals may be a target film thickness, RI, surface roughness, density, or non-uniformity, for example. Based on the determined difference, an adjustment to a process parameter for a processing operation may be made for a subsequent wafer (e.g., a feedback loop) or for that wafer (e.g., a feedforward loop).

Figure 16:
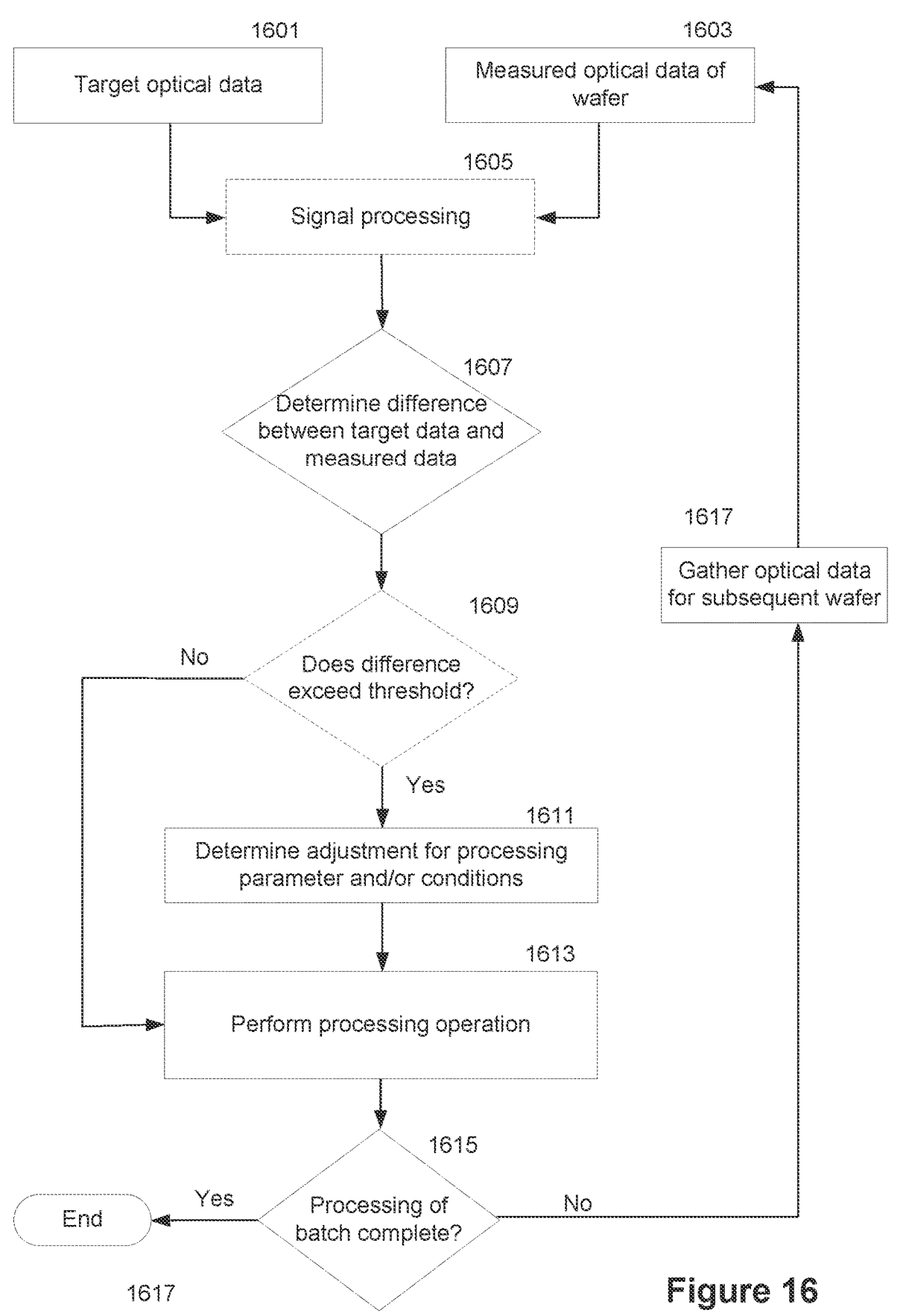
FIG. 16 depicts a control loop in accordance with disclosed embodiments.

In some embodiments, a feedback loop may be provided in which a target deposition thickness may be compared against a measured deposition thickness, and a difference between these may be used to determine an adjustment to processing conditions for a subsequent wafer. FIG. 16 depicts a control loop in accordance with disclosed embodiments. As described below, this control loop may be a feedback and/or feedforward control loop. The target deposition thickness here, indicated by block 1601, may be represented as target optical data which may be, in some instances previously measured and stored optical data corresponding to deposited material that is the desired, target, and correct thickness. This target optical data may be considered calibration or control data upon which the transfer function may be based; in some embodiments, this target optical data may be considered second optical data.

In block 1603, optical data may be received and measured by the one or more detectors of the optical metrology module. This optical data may represent various measured aspects of the wafer. For example, the optical data may be measured average reflectivity of the whole wafer, of one or more regions of the wafer (such as the area 570 in FIG. 5), of one region along the center region, of one region along the center region and another region in an edge region of the wafer, or any combination of various areas on the wafer. This optical data gathered on the wafer may be considered, in some embodiments, first optical data.

In some embodiments, signal processing may optionally be performed on the measured optical data of the wafer, the target optical data, or both, as represented by block 1605. This signal processing may vary and include, for example, weighting, smoothing, filtering, amplifying, reducing noise, averaging data over one or more previously processed wafer, or the like.

In block 1607, the control logic may make one or more determinations regarding the target optical data and the measured optical data of a wafer. This control logic may be a part of a controller as described in more detail below. In some instances, a difference may be determined between the stored target optical data and the measured optical data (i.e. between the second optical data and the first optical data, respectively). In some embodiments, determining this difference may be a part of generating the metric associated with the property described herein. Additionally, or alternatively, a difference may be determined between the stored target optical data and the measured optical data of more than one wafer, such as N wafers processed before the subject wafer. This may include, for instance, averaging the optical data of the N wafers or comparing the results of each N wafer to the target data. In some embodiments, as represented by optional block 1609, a further determination may be made as to whether the difference meets or exceeds a threshold and if so, the loop may continue to block 1611; if the difference does not meet or exceed the threshold, then the loop may skip block 1611 and proceed directly to block 1613.

The determinations of blocks 1607, 1609, and/or block 1611 may be regarding any of the film properties described herein, such as film thickness, film thickness, film non-uniformity, film density, film roughness, and/or film RI. In some embodiments, blocks 1607, 1609, and/or block 1611, these determinations may include applying the measured optical data from block 1603 to a transfer function that is based, at least in part, on the target optical data represented in block 1601 as described above, including with respect to FIGS. 15A and 15B. This may include generating one or more metrics associated with the film property, such as a value of the film property, e.g., a thickness value of the film or a value of the film's surface roughness, by applying the optical data to the transfer function.

As provided herein, the stored optical data may be that of one or more wafers processed in the same batch of wafers as the measured wafer, and/or calibration or test wafers. The optical data used may be that described herein, including magnitude, intensity, polarization, and/or attenuation of light reflected off the wafer. In some embodiments, the determinations of a difference between target data and measured data may also include determining whether center-to-edge thickness, azimuthal thickness, and/or thickness uniformity exceeded or did not meet a particular threshold.

After block 1607, or after optional block 1609 if the difference exceeds the threshold, in block 1611 the control logic may determine whether any adjustments should be made to one or more processing parameters and/or processing conditions, and may apply such adjustments to the to one or more processing parameters and/or processing conditions. For some ELD deposition processes, the adjustments may be made to, for example, deposition time, wafer temperature, sequencing and/or timing of solution dispensing locations, flow rate, chuck rotation speed, and/or purge gas flow rate. In some PVD processes, the adjustments may be made to, for example, deposition time, RF power, e-beam power, chamber pressure, and/or target position and orientation towards substrate. In some CVD processes, the adjustments may be made to, for example, deposition time, RF power, bias voltage or waveform, substrate temperature, precursor or carrier gas flow rate, chamber pressure, and/or or orientation and location of various chamber components to shape the plasma.

Separately from, or as part of, this adjustment determination in block 1611, the process conditions and/or process parameters may be adjusted. This adjustment may not occur until the processing operation is actually performed in block 1613. Accordingly, if it is determined that adjustments are to be made to the process conditions and/or process parameters, then the processing operation in block 1613 may be performed according to, and/or with, the adjusted process conditions and/or process parameters.

If optional block 1609 is performed and the difference does not exceed the threshold, then the process conditions and/or process parameters are not adjusted and the processing operation of block 1615 may be performed according to the originally set process conditions and/or process parameters or the last used process conditions and/or process parameters, for example.

Once the processing operation on the wafer is complete in block 1613, a determination may be made as to whether the batch of wafers has been fully processed. If yes, then the loop may end. If not, then the loop may gather optical data of a subsequent wafer as indicated by block 1617. This newly gathered optical data may be used as block 1603 and the loop may be repeated.

Figure 17:
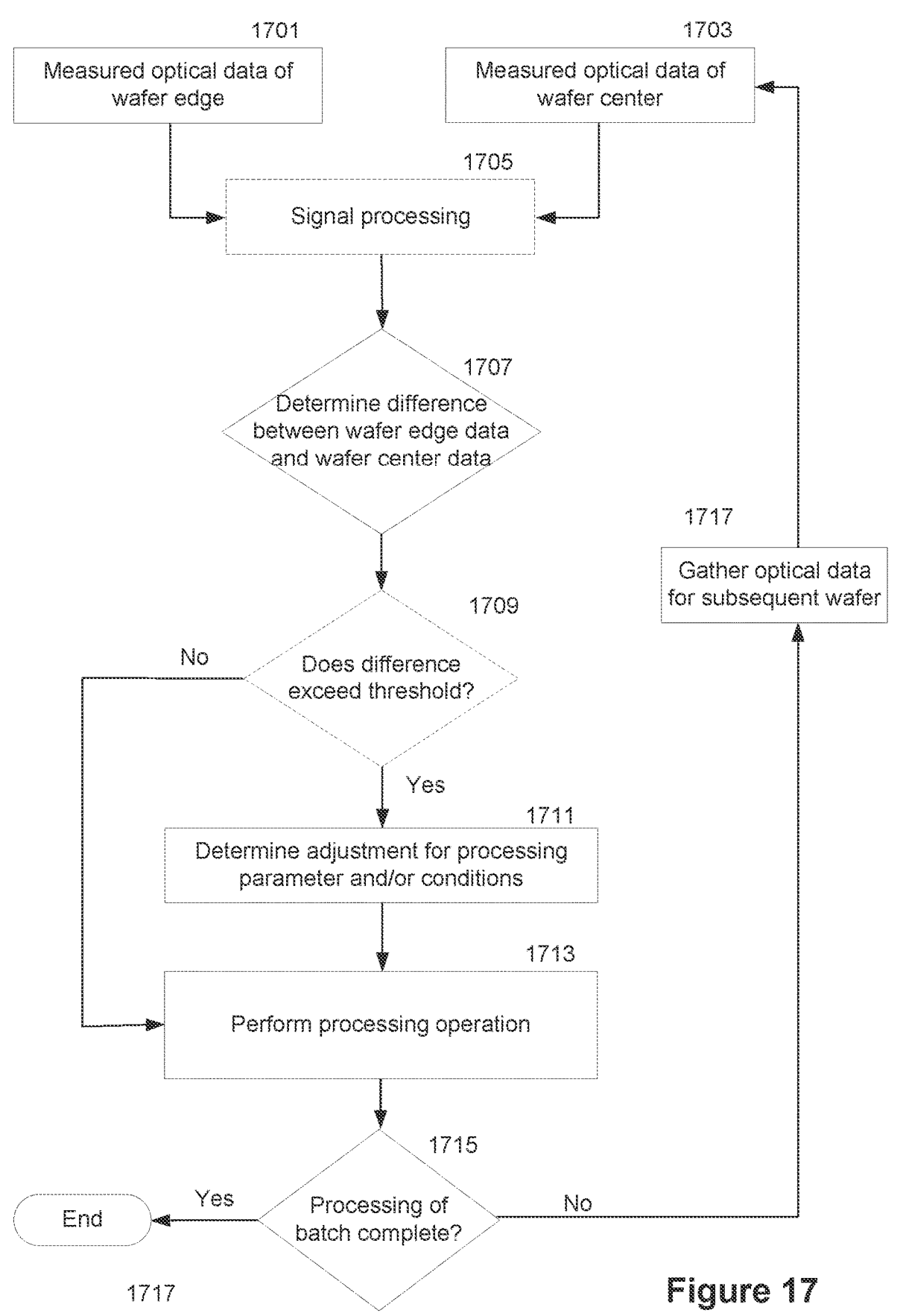
FIG. 17 depicts another control loop.

In some embodiments, a feedback control loop may be performed based on measured optical data of one or more center or interior regions of the wafer and the edge region of the wafer. FIG. 17 depicts another control loop; as described below, this control loop may be a feedback and/or feedforward control loop. This FIG. 17 control loop is similar to FIG. 16 except for some noted differences. Here in FIG. 17, measured optical data is obtained on the wafer edge in block 1701 (which may be considered the first optical data) and measured optical data is obtained in one or more center and/or interior regions of the wafer in block 1703 (which may be referred to as the second optical data). Similar to FIG. 16, optional block 1705 may process the received signals as described above, including, for example, averaging this data of previously measured wafers or filtering the data.

In block 1707, a difference may be determined between the measured optical data of the wafer edge and the measured optical data of the wafer center and/or interior. Additionally, or alternatively, a difference may be determined between the measured optical data of more than one wafer edges and/or measured optical data of more than one wafer center and/or interior regions, such as of N wafers processed before the subject wafer. In some embodiments, as represented by optional block 1709, a further determination may be made as to whether the difference meets or exceeds a threshold and if so, the loop may continue to block 1711; if the difference does not meet or exceed the threshold, then the loop may skip blocks 1711 and proceed directly to block 1713.

As provided above with FIG. 16, the one or more determinations of block 1707, 1709, and/or 1711 may be made about various film properties such as, for example, film thickness, film non-uniformity, film density, film roughness, and/or film RI. This may include determining any of these film properties by comparing the measured optical data to stored optical data. In some embodiments, these determinations of blocks 1707, 1709, and/or block 1711, may include applying the measured optical data from blocks 1701 and 1703 to a transfer function that is based, at least in part, on target optical data as described above, including with respect to FIGS. 15A and 15B. As noted above, this may include generating one or more metrics associated with the film property, such as a value of the film property, e.g., a thickness value of the film or a value of the film's surface roughness, by applying the optical data to the transfer function.

In some instances, the stored optical data may be that of one or more wafers processed in the same batch of wafers as the measured wafer, and/or calibration or test wafers. The optical data used may be that described herein, including magnitude, intensity, polarization, and/or attenuation of light reflected off the wafer. In some embodiments, the determinations of a difference between target data and measured data may also include determining whether center-to-edge thickness, azimuthal thickness, and/or thickness uniformity exceeded or did not meet a particular threshold.

Similar to FIG. 16, adjustments to one or more process conditions and/or parameters may be determined and applied in block 1711 based on the measured optical data of the wafer edge and/or the measured optical data of the wafer center and/or interior, including based on the determined difference in block 1707. The same adjustments may be made as those described above, including any for ELD, CVD, and/or PCD deposition processes. In block 1713, the processing operation may be performed according to the adjusted process conditions and/or parameters in block 1711 and if no adjustments are made, then the processing operation may be performed according to an original or previously used set of processing conditions and/or parameters. Blocks 1715 and 1717 are performed the same as FIG. 16 except that block 1717 gathers optical data of the wafer edge and the wafer center and/or interior region.

As noted above, the control loops of FIGS. 16 and 17 may be performed in some embodiments as feedback loops. This may include gathering the optical data in blocks 1603, 1701, and/or 1703 from a wafer that has been processed in the processing chamber, and/or the adjustments in blocks 1611 and 1711 for processing operation in blocks 16'13 and 1713 is for a subsequent wafer.

Alternatively, or additionally, some implementations may perform the control loops of FIGS. 16 and 17 as feed forward control loops. This may include gathering the optical data in blocks 1603, 1701, and/or 1703 from a wafer before it has been processed, and/or the adjustments in block 1711 for processing operation in block 1713 is for that wafer from which the data was gathered. In some embodiments, FIGS. 16 and 17 may be used as both feed forward and feedback control loops. Some of these embodiments may be performed by measuring the optical data in blocks 1603, 1701, and/or 1703 from the same wafer before and/or after performing a processing operation of blocks 1613 and 1713. This may also include, in some implementations, adjusting a processing parameter and/or procession condition of blocks 1611 and 1711 before and/or after processing the wafer in blocks 1613 and 1713. After processing the wafer in blocks 1613 and 1713, the control loops may be repeated for another subsequent wafer.

While some of the implementations described herein provide a feedback loop in which information about the previous wafer is provided to adjust process conditions for a subsequent wafer, that is not necessarily the case. There is, in principle, no reason the invention cannot be extended to processing wafers in situ. In the case of wafer in a vapor deposition environment, it may be possible to collect optical data from the wafer while it is being processed, without removing it from the process chamber. In the case of a process that involves immersing the wafer in a liquid such as electroplating or electroless plating, it may also be possible to perform the optical measurement with the optical metrology module in the electroplating cell or through transparent viewports while wafer is being processed. If the nature of the process allows, the wafer may be temporarily removed from the liquid to capture the image midway through the deposition process. This may slow the process slightly, but for some applications it may be acceptable.

Additionally, or alternatively, to the making one or more adjustments in response to the determinations of FIGS. 16 and 17, other actions with the processing may be taken in response to such determinations. This may include, for example, issuing a warning, a stop signal to the processing, a cleaning operation of the processing chamber, a conditioning of the deposition chamber, a check of the processing chamber systems, and/or a recalibration of the processing chamber systems. In some implementations, these actions may be made when the determination is made, based on the measured optical data, that the difference between target and/or measured data exceeds one or more thresholds as described herein.

As noted above, various parameters and conditions may be adjusted. In general, any parameter that affects the deposition rate, deposition uniformity, deposition quality, etc. of a layer provided over the surface of the wafer may be adjusted. For some ELD deposition processes, the adjustments may be made to, for example, deposition time, wafer temperature, sequencing and/or timing of solution dispensing locations, flow rate, chuck rotation speed, and/or purge gas flow rate. In some PVD processes, the adjustments may be made to, for example, deposition time, RF power, e-beam power, chamber pressure, and/or target position and orientation towards substrate. In some CVD processes, the adjustments may be made to, for example, deposition time, RF power, bias voltage or waveform, substrate temperature, precursor or carrier gas flow rate, chamber pressure, and/or or orientation and location of various chamber components to shape the plasma.

Additionally, or alternatively, to the above description, the optical metrology module may be used to tune a process. For example, tuning a deposition process to a target thickness or optimal uniformity conventionally uses an iterative tuning process. In this process, a wafer is run with certain parameters in the deposition module, and then the wafer is taken to a separate instrument to measure film thickness by XRF, XRR, ellipsometry, etc. There generally is an inconsistent length of time between wafer processing and film measurement, which can add to measurement uncertainty. Also, manual iterative tuning using a separate metrology instrument is a time-consuming process because there is time delay between the wafer run and the operator seeing the result to inform next iterative tuning run.

Using the optical metrology module described herein advantageously provides an in-line method to estimate thin metal film thickness and to provide a nearly instantaneous result to an operator to inform next tuning iteration, or to automatically adjust deposition parameters to better match the next tuning iteration result to target without operator intervention. Furthermore, an in-line method provides a measurement with very short and tightly-controlled time delay between film deposition and measurement, since it is integrated on the deposition tool.

The process controls and other techniques provided herein may be performed for one or more wafers in a batch of wafers. Semiconductor processes are often carried out in batches; each batch includes a plurality of substrates that may have anywhere from a few substrates to several hundred substrates. A batch of substrates may be defined as the number of substrates that may be processed for a particular process before or when an accumulation limit is reached in the processing chamber. For example, an ALD process in a particular chamber may have an accumulation limit of 20,000 Å which is the point at which the accumulation on the chamber causes adverse effects on substrates processed in that chamber. Accordingly, a batch of substrates processed in that chamber is limited to the number of substrates that may be processed in that chamber before the accumulation limit of 20,000 Å is reached. In certain embodiments, the first wafer in a batch is the first wafer processed after a chamber clean. In multi-station reactors, multiple wafers are processed together, so the first wafer may be part of a group of wafers that are collectively the first wafers processed in a batch. The last wafer is the last wafer processed before a chamber clean. In multi-station reactors there will be multiple last wafers. Large batch sizes are advantageous in terms of maximizing throughput, since less time is lost cleaning and preparing the chamber between batches. In some cases, a batch includes at least about 50 substrates, for example at least about 100 substrates, or at least about 200 substrates, or at least about 300 substrates, or at least about 400 substrates, or at least about 500 substrates.

Applications

The optical metrology module described herein may be used in both etching and deposition applications. In both cases, there will be a film, typically a thin film, on a wafer and that film was either deposited or partially removed by the process that is being controlled. It is this film that may be measured and about which the various determinations may be made.

This includes the ELD apparatus of FIG. 1 described above having an optical metrology module implemented therein. The system controller 130 (which may include one or more physical or logical controllers) controls some or all of the properties of the ELD apparatus 100, including the optical metrology module and the implementation of any controls and techniques provided herein. The system controller 130 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 130 or they may be provided over a network. In certain embodiments, the system controller 130 executes system control software.

The system control software in the ELD apparatus 100 may include instructions for controlling the timing, mixture of electrolyte components, inlet pressure, plating cell pressure, plating cell temperature, substrate temperature, current and potential applied to the substrate and any other electrodes, substrate position, substrate rotation, and other parameters of a particular process performed by the ELD apparatus 100. System control logic may be configured in any suitable way. For example, various process tool component sub-routines or control objects may be written to control operation of the process tool components necessary to carry out various process tool processes. System control software may be coded in any suitable computer readable programming language. The logic may also be implemented as hardware in a programmable logic device (e.g., an FPGA), an ASIC, or other appropriate vehicle.

In some embodiments, system control logic includes input/output control (IOC) sequencing instructions for controlling the various parameters described above. For example, each phase of an ELD process may include one or more instructions for execution by the system controller 130. The instructions for setting process conditions for an immersion process phase may be included in a corresponding immersion recipe phase. In some embodiments, the ELD recipe phases may be sequentially arranged, so that all instructions for an ELD process phase are executed concurrently with that process phase.

The control logic may be divided into various components such as programs or sections of programs in some embodiments. Examples of logic components for this purpose include a substrate positioning component, an electrolyte composition control component, a pressure control component, a heater control component, and a potential/current power supply control component.

In some embodiments, there may be a user interface associated with the system controller 130. The user interface may include a display screen, graphical software displays of the apparatus and/or process conditions, and user input devices such as pointing devices, keyboards, touch screens, microphones, etc.

In some embodiments, parameters adjusted by the system controller 130 may relate to process conditions. Non-limiting examples include bath conditions (temperature, composition, and flow rate), substrate position (rotation rate, linear (vertical) speed, angle from horizontal) at various stages, etc. These parameters may be provided to the user in the form of a recipe, which may be entered utilizing the user interface.

Signals for monitoring the process may be provided by analog and/or digital input connections of the system controller 1301 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

The system controller may have program instructions to control any apparatus to execute any of the techniques and control loops described above. This may include controlling the one or more first processors to cause the illumination source to emit a light onto the wafer, cause the movement mechanism to cause relative motion between the wafer and one or more detectors, cause the one or more detectors to detect light reflected off the wafer and generate first optical data corresponding to the detected light, apply the first optical data to a transfer function regarding second optical data and values of a property of the first material, wherein the applying returns a metric associated with the property of the first material on the first wafer, determine, based on the applying, an adjustment to one or more processing parameters for the processing module, and cause the processing module to perform a processing operation according to the adjusted one or more processing parameters.

In addition to ELD processes, the applications of this description also apply to other deposition processes, including electroplating, as well as vapor phase deposition processes such as chemical vapor deposition ("CVD"), plasma-enhanced CVD ("PECVD"), atomic layer deposition ("ALD"), low pressure CVD, ultra-high CVD, physical vapor deposition ("PVD"), and conformal film deposition ("CFD"). Some CVD processes may deposit a film on a wafer surface by flowing one or more gas reactants into a reactor which form film precursors and by-products. The precursors are transported to the wafer surface where they are adsorbed by the wafer, diffused into the wafer, and deposited on the wafer by chemical reactions, including by the generation of a plasma in PECVD.

In a typical PECVD reaction, a substrate is heated to an operating temperature and exposed to one or more volatile precursors which react and/or decompose to produce the desired deposit on the substrate surface. The PECVD process generally begins by flowing one or more reactants into the reaction chamber. The reactant delivery may continue as a plasma is generated which exposes the substrate surface to the plasma, which in turn causes deposition to occur on the substrate surface. This process continues until a desired film thickness is reached, after which the plasma is generally extinguished and the reactant flow is terminated. Next, the Action chamber may be purged and post-deposition steps may be performed.

Some other deposition processes involve multiple film deposition cycles, each producing a "discrete" film thickness. ALD is one such film deposition method, but any technique which puts down thin layers of film and used in a repeating sequential matter may be viewed as involving multiple cycles of deposition. ALD is a film forming technique which is well-suited to the deposition of conformal films due to the fact that a single cycle of ALD only deposits a single thin layer of material, the thickness being limited by the amount of one or more film precursor reactants which may adsorb onto the substrate surface (i.e., forming an adsorption-limited layer) prior to the film-forming chemical reaction itself. Multiple "ALD cycles" may then be used to build up a film of the desired thickness, and since each layer is thin and conformal, the resulting film substantially conforms to the shape of the underlying devices structure. In certain embodiments, each ALD cycle includes the following steps: (1) Exposure of the substrate surface to a first precursor, (2) purge of the reaction chamber in which the substrate is located, (3) activation of a reaction of the substrate surface, typically with a plasma and/or a second precursor, and (4) purge of the reaction chamber in which the substrate is located. The duration of each ALD cycle may typically be less than 25 seconds or less than 10 seconds or less than 5 seconds. The plasma exposure step (or steps) of the ALD cycle may be of a short duration, such as a duration of 1 second or less, for example. The plasma may be of other durations longer than that 1 second, such as 2 seconds, 5 seconds, or 10 seconds, for instance.

Etching processes include thermal etch processes, plasma etch processes, ion milling, atomic layer etching ("ALE"), etc. This may also include wet etch processes, which have many similarities to liquid based deposition processes. ALE processes remove thin layers of material using sequential self-limiting reactions. Generally, an ALE cycle is the minimum set of operations used to perform an etch process one time, such as etching a monolayer. The result of one ALE cycle is that at least some of a film layer on a substrate surface is etched. Typically, an ALE cycle includes a modification operation to form a reactive layer, followed by a removal operation to remove or etch only this reactive layer. The cycle may include certain ancillary operations such as removing one of the reactants or byproducts. Generally, a cycle contains one instance of a unique sequence of operations.

Results

Figure 18:
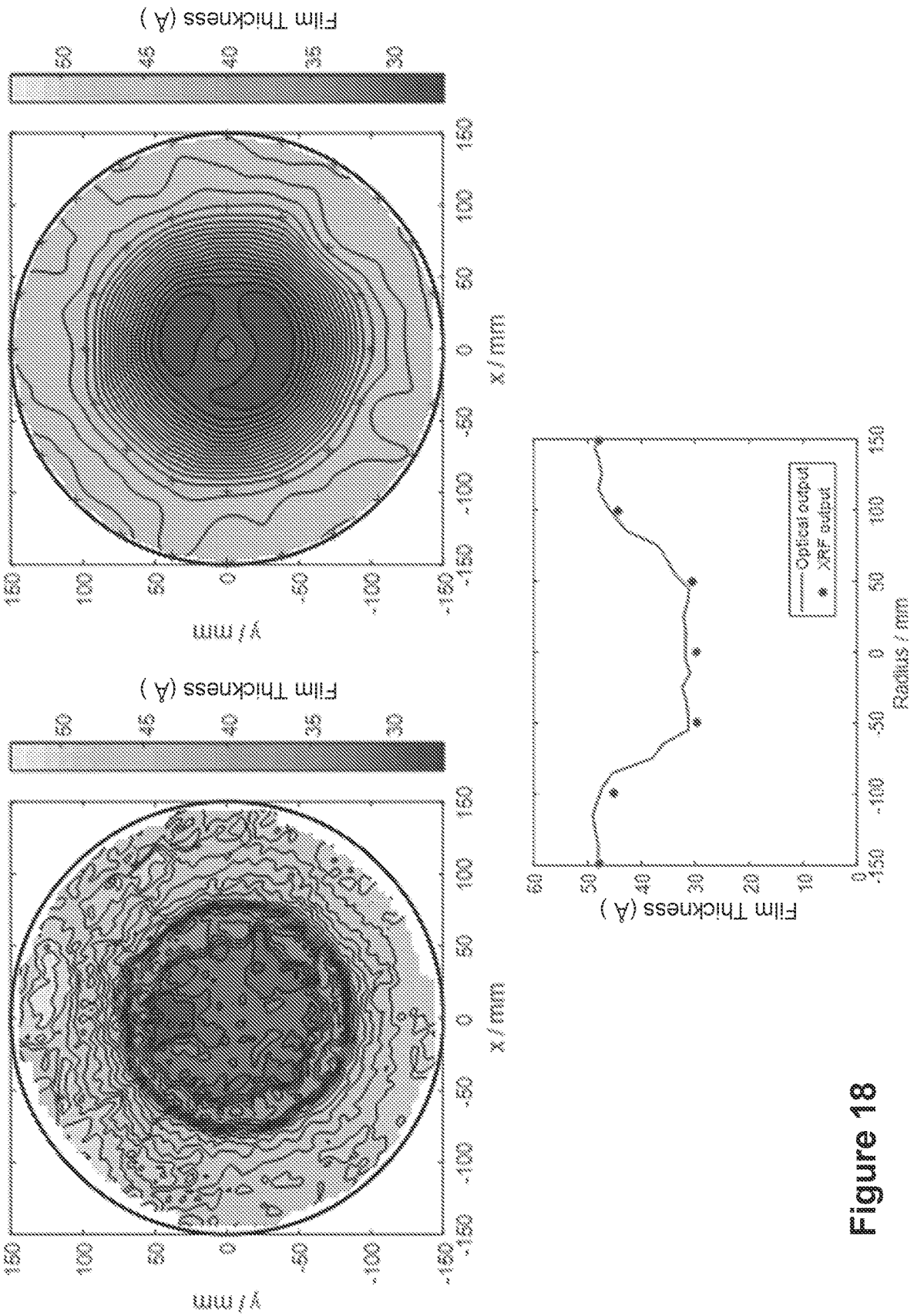
FIG. 18 depicts two maps and a graph of a film's thickness as measured using various techniques.

Using the optical metrology module provided herein enables the measurement and determination of a film's thickness, among other things. Faster and more detailed than conventional techniques. FIG. 18 depicts two maps and a graph of a film's thickness as measured using various techniques. The top left thickness map shows the thickness measured and determined using an implementation of the optical metrology module described herein and the top right thickness map shows the thickness measured and determined using an XRF technique. The bottom graph shows an example comparison of the data obtained by both techniques. As can be seen, the optical metrology module provides more measurements points, over 2,000, and details of the film thickness than the XRF technique which provides about 48 points and an interpolated contour. Additionally, the optical metrology module results were obtained in less than 0.1 seconds and the XRF technique obtained 48 measurement points in about 1,000 seconds. As further illustrated in the bottom graph, the optical metrology module provides a more complete, detailed profile of the wafer than the XRF technique.

Using the optical metrology module described herein also advantageously integrates an in-line thickness and thickness uniformity monitoring device into the wafer processing tool in order to monitor the processing result on, for example, every wafer that passes though the tool, to minimize the delay between film processing and measurement result, and to better facilitate fault triggering and closed-loop feedback control. Furthermore, it advantageously uses a non-destructive method that gives a repeatable absolute or relative result regardless of where the sampling occurs on a patterned wafer, and that is insensitive to underlying film stack composition or conductivity.

Various computational elements including processors, memory, instructions, routines, models, or other components may be described or claimed as "configured to" perform a task or tasks. In such contexts, the phrase "configured to" is used to connote structure by indicating that the component includes structure (e.g., stored instructions, circuitry, etc.) that performs the task or tasks during operation. As such, the unit/circuit/component can be said to be configured to perform the task even when the specified component is not necessarily currently operational (e.g., is not on).

The components used with the "configured to" language may refer to hardware—for example, circuits, memory storing program instructions executable to implement the operation, etc. Additionally, "configured to" can refer to generic structure (e.g., generic circuitry) that is manipulated by software and/or firmware (e.g., an FPGA or a general-purpose processor executing software) to operate in manner that is capable of performing the recited task(s). Additionally, "configured to" can refer to one or more memories or memory elements storing computer executable instructions for performing the recited task(s). Such memory elements may include memory on a computer chip having processing logic. In some contexts, "configured to" may also include adapting a manufacturing process (e.g., a semiconductor fabrication facility) to fabricate devices (e.g., integrated circuits) that are adapted to implement or perform one or more tasks.

While the subject matter disclosed herein has been particularly described with respect to the illustrated embodiments, it will be appreciated that various alterations, modifications and adaptations may be made based on the present disclosure, and are intended to be within the scope of the present invention. It is to be understood that the description is not limited to the disclosed embodiments but, on the contrary, is intended to cover various modifications and equivalent arrangements included within the scope of the claims.

What is claimed is:

1. A method of processing wafers in a semiconductor processing tool having a processing chamber and an optical metrology module, the method comprising:

illuminating a first region on a first wafer while the first wafer is positioned within the semiconductor processing tool, wherein the first wafer has a first layer of a first material that is at least semi-transparent to light and has a measurable extinction coefficient, and wherein the first region is a first fraction of the first wafer's surface;

detecting, while the first wafer is positioned within the semiconductor processing tool, light reflected off the first material and off a surface underneath the first material in the first region of the first wafer using one or more detectors of the optical metrology module and generating first optical data corresponding to the detected light;

generating a metric associated with a property of the first material on the first wafer by applying the first optical data to a transfer function that relates the first optical data to the metric associated with the property of the first material on the first wafer;

determining, based on the applying, an adjustment to one or more processing parameters for a processing module of the semiconductor processing tool; and performing or modifying a processing operation in the processing module according to the adjusted one or more processing parameters.

2. The method of claim 1, wherein the processing operation is performed on a second wafer that enters the processing module after the first wafer was processed in the processing module.

3. The method of claim 2, wherein:

the adjustment causes the first layer of the first material on the second wafer to have a second metric different than the metric, and the property is an item selected from the group consisting of: thickness, index of refraction, surface roughness, density, and a variation of any of the foregoing over the wafer surface.

4. The method of claim 2, wherein:

the adjustment causes the metric of the property of the first material to remain substantially the same during the processing operation, and the property is selected from the group consisting of: thickness, index of refraction, surface roughness, and density.

5. The method of claim 2, further comprising:

Illuminating a second region of the second wafer positioned within the semiconductor processing tool, wherein the second region is a second fraction of the second wafer's surface;

detecting, while the second wafer is positioned within the semiconductor processing tool, light reflected off the first material and off a surface underneath the first material in the second region of the second wafer using the one or more detectors and generating second optical data corresponding to the detected light;

generating a second metric associated with the property of the first material on the second wafer by applying the second optical data to a transfer function that relates the second optical data to the second metric associated with the property of the first material on the second wafer;

determining, based on the applying, a second adjustment to one or more processing parameters for the processing module; and performing or modifying a second processing operation in the processing module according to the second adjusted one or more processing parameters.

6. The method of claim 1, wherein:

generating the first optical data is performed before the first wafer has been fully processed in the processing module, and performing or modifying the processing operation comprises modifying the processing operation before the first wafer has been fully processed in the processing module.

7. The method of claim 6, further comprising, after the performing or modifying:

illuminating a first region on a first wafer while the first wafer is positioned within the semiconductor processing tool;

detecting, while the first wafer is positioned within the semiconductor processing tool, light reflected off the first material and off the surface underneath the first material in the first region of the first wafer using one or more detectors and generating second optical data corresponding to the detected light;

generating a second metric associated with the property of the first material on the first wafer by applying the second optical data to a transfer function that relates the second optical data to the metric associated with the property of the first material on the first wafer;

determining, based on the applying, a second adjustment to one or more processing parameters for a processing module of the semiconductor processing tool; and performing or modifying a second processing operation in the processing module according to the second adjusted one or more processing parameters.

8. The method of claim 1, wherein the adjustment comprises an adjustment to an item selected from the group consisting of: a deposition time, a wafer temperature, a sequencing and/or timing of solution dispensing locations, a flow rate, a chuck rotation speed, a purge gas flow rate, an RF power, an e-beam power, a chamber pressure, a target position and orientation towards substrate, a bias voltage or waveform, precursor flow rate, carrier gas flow rate, or orientation and location of various chamber components to shape a plasma.

9. The method of claim 1, wherein the generating comprises determining a difference between the first optical data and target optical data.

10. The method of claim 9, further comprising determining whether the difference between the first optical data and the target optical data exceeds a threshold, wherein the determining the adjustment is further based on the determination of whether the difference exceeds the threshold.

11. The method of claim 1, wherein:

the first optical data includes a first subset of optical data associated with an interior region of the first wafer and a second subset of optical data associated with an edge region of the first wafer, and the generating includes determining a difference between the first subset and the second subset.

12. The method of claim 1, wherein the generating includes determining a difference between the first optical data and optical data from a second wafer.

13. The method of claim 1, further comprising causing relative motion between the first wafer and one or more detectors during the illuminating and the detecting.

14. The method of claim 1, wherein the metric is further based on calibration data.

15. The method of claim 14, wherein the calibration data is based on target data of target wafers.

16. The method of claim 1, wherein the first fraction is at least one fifth the surface area of the first wafer.

17. The method of claim 16, wherein the first fraction is at least 80% of the surface area of the first wafer.

18. The method of claim 1, wherein:

the processing operation in the processing module deposits material onto a wafer, and the adjustment to the one or more processing parameters reduces non-uniformity of the deposited material.

19. The method of claim 1, wherein the light is white light.

20. The method of claim 1, wherein the light has wavelengths between about 375 nm and about 800 nm.

* * * * *